(12) United States Patent
Kotake et al.

(10) Patent No.: US 8,736,064 B2
(45) Date of Patent: May 27, 2014

(54) STRUCTURE AND METHOD OF MAKING INTERCONNECT ELEMENT HAVING METAL TRACES EMBEDDED IN SURFACE OF DIELECTRIC

(75) Inventors: Hideki Kotake, Tokyo (JP); Kiyoshi Hyodo, Tokyo (JP); Inetaro Kurosawa, Tokyo (JP); Yukio Hashimoto, Hitachinaka (JP); Toku Yoshino, Tokyo (JP); Tomoo Iijima, Tokyo (JP)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 12/941,511

(22) Filed: Nov. 8, 2010
(Under 37 CFR 1.47)

(65) Prior Publication Data

US 2011/0057324 A1    Mar. 10, 2011

Related U.S. Application Data

(63) Continuation of application No. 11/805,300, filed on May 23, 2007, now abandoned, which is a continuation of application No. 11/541,734, filed on Oct. 2, 2006, now abandoned, which is a continuation of application No. 11/338,455, filed on Jan. 24, 2006, now abandoned.

(30) Foreign Application Priority Data

Jan. 24, 2005 (JP) .................................. 2005-15970

(51) Int. Cl.
*H01L 23/522* (2006.01)
(52) U.S. Cl.
USPC ........... 257/774; 257/773; 257/750; 257/758; 257/E23.145; 438/629; 438/637; 438/639

(58) Field of Classification Search
USPC .......... 257/773, 774, 758, 750; 438/629, 637, 438/639
See application file for complete search history.

(56) References Cited

U.S. PATENT DOCUMENTS 4,980,034 A * 12/1990 Volfson et al. ................. 205/122
5,432,999 A * 7/1995 Capps et al. ................... 438/109

(Continued)

FOREIGN PATENT DOCUMENTS

| JP | 02159789 A | 6/1990 |
|---|---|---|
| JP | 10084186 A | 3/1998 |

(Continued)

OTHER PUBLICATIONS

Japanese Decision of Rejection for Application No. 2007-552389 dated Nov. 27, 2012.

*Primary Examiner* — Thinh T Nguyen
(74) *Attorney, Agent, or Firm* — Lerner, David, Littenberg, Krumholz & Mentlik, LLP

(57) ABSTRACT

An interconnect element is provided. A monolithic dielectric element has a first exposed major surface, a plurality of first recesses extending inwardly from the first major surface, and a second exposed major surface remote from the first major surface, a plurality of second recesses extending inwardly from the second major surface. A plurality of first metal interconnect patterns are embedded in the plurality of first recesses and extend in one or more directions along the first major surface. A plurality of second metal interconnect patterns are embedded in the plurality of second recesses and extend in one or more directions along the second major surface. A plurality of non-hollow metal posts extend through the dielectric element between at least some of the plurality of first metal interconnect patterns and at least some of the plurality of second metal interconnect patterns.

25 Claims, 13 Drawing Sheets

(56) References Cited

U.S. PATENT DOCUMENTS

| | | | |
|---|---|---|---|
| 5,576,519 A | 11/1996 | Swamy | |
| 5,876,842 A * | 3/1999 | Duffy et al. | 428/209 |
| 6,261,941 B1 * | 7/2001 | Li et al. | 438/618 |
| 6,312,791 B1 * | 11/2001 | Fasano et al. | 428/210 |
| 6,388,204 B1 | 5/2002 | Lauffer et al. | |
| 6,452,117 B2 | 9/2002 | Curcio et al. | |
| 6,504,111 B2 * | 1/2003 | Curcio et al. | 174/264 |
| 6,528,874 B1 * | 3/2003 | Iijima et al. | 257/700 |
| 6,889,433 B1 * | 5/2005 | Enomoto et al. | 29/852 |
| 7,078,816 B2 * | 7/2006 | Japp et al. | 257/762 |
| 2005/0224985 A1 * | 10/2005 | Japp et al. | 257/762 |

FOREIGN PATENT DOCUMENTS

| | | |
|---|---|---|
| JP | 2002252250 A | 9/2002 |
| JP | 2002290048 A | 10/2002 |
| JP | 2003218169 A | 7/2003 |
| JP | 2003298212 A | 10/2003 |
| JP | 2004007006 A | 1/2004 |
| JP | 2004253432 A | 9/2004 |

* cited by examiner

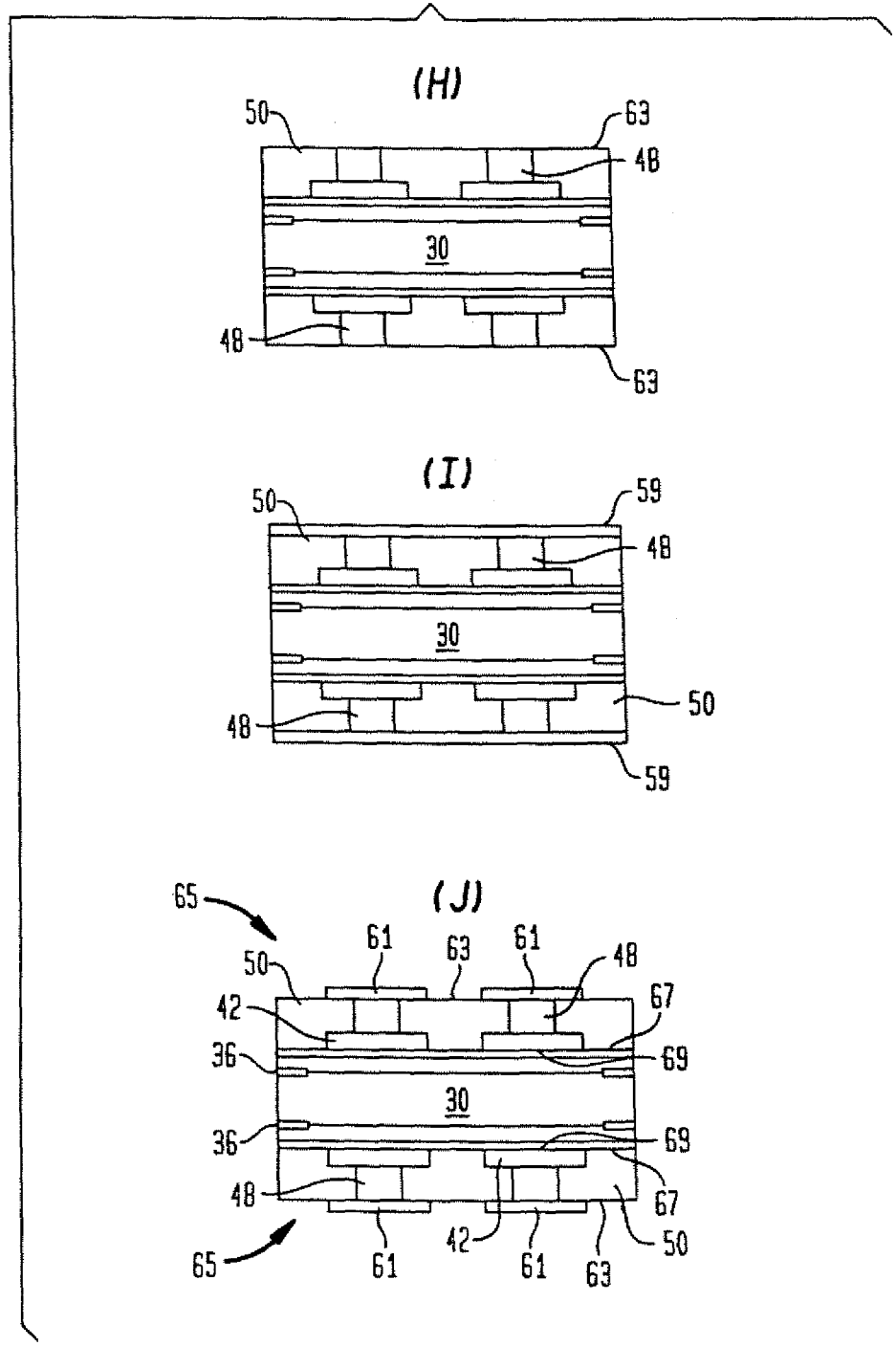

(K)

(G)

(H)

(I)

STRUCTURE AND METHOD OF MAKING INTERCONNECT ELEMENT HAVING METAL TRACES EMBEDDED IN SURFACE OF DIELECTRIC

CROSS-REFERENCE TO RELATED APPLICATIONS

This application is a continuation of U.S. application Ser. No. 11/805,300, filed May 23, 2007, which is a continuation of U.S. application Ser. No. 11/541,734, filed Oct. 2, 2006, which is a continuation of U.S. application Ser. No. 11/338,455, filed Jan. 24, 2006, the disclosures of which is hereby incorporated herein by reference. The present application is based upon and claims the benefit of priority from Japanese Patent Application No. 2005-15970, filed Jan. 24, 2005, the disclosure of which is incorporated herein by reference.

BACKGROUND OF THE INVENTION

The present invention specifically relates to interconnect structures for microelectronics, e.g., in the packaging of microelectronic units such as integrated circuits ("ICS" or "chips") and other interconnect structures, e.g., circuit panels such as includes printed or other types of wiring boards.

There is a present need to provide interconnect elements having either a single layer or multiple layers of metal interconnect patterns permitting selective interconnection to external circuit elements.

SUMMARY OF THE INVENTION

In accordance with an aspect of the invention, an interconnect element is provided. A monolithic dielectric element has a first exposed major surface, a plurality of first recesses extending inwardly from the first major surface, and a second exposed major surface remote from the first major surface, a plurality of second recesses extending inwardly from the second major surface. A plurality of first metal interconnect patterns are embedded in the plurality of first recesses and extend in one or more directions along the first major surface. A plurality of second metal interconnect patterns are embedded in the plurality of second recesses and extend in one or more directions along the second major surface. A plurality of non-hollow metal posts extend through the dielectric element between at least some of the plurality of first metal interconnect patterns and at least some of the plurality of second metal interconnect patterns.

In accordance with this aspect of the invention, the plurality of first metal interconnect patterns may have outer surfaces substantially co-planar with the first major surface. The plurality of second metal interconnect patterns may have outer surfaces substantially co-planar with the second major surface.

In further accordance with this aspect of the invention, the dielectric element may include one or more thermoplastic resins. The dielectric element may include at least one resin selected from the group consisting of PEEK (polyether ether ketone), PES (polyethersulfone), PPS (polyphenylene sulfide), PEN (polyethylene napthalate), a PEEK-PES polymer blend, and liquid crystal polymers. A thickness of each of the plurality of first metal interconnect patterns may be at least 10 microns. A thickness of each of the plurality of second metal interconnect patterns may be at least 10 microns. Each of the plurality of metal posts may include copper. Each of the plurality of metal posts may include high purity copper. A length of each of the plurality of metal posts may be at most 150 microns.

In still further accordance with this aspect of the invention, at least some of the plurality of first metal interconnect patterns may be traces exposed at the first major surface of the dielectric element. At least some of the plurality of first metal interconnect patterns may be contacts exposed at the first major surface of the dielectric element. At least some of the plurality of second metal interconnect patterns may be traces exposed at the first major surface of the dielectric element. At least some of the plurality of second metal interconnect patterns may be contacts exposed at the second major surface of the dielectric element. The plurality of first metal interconnect patterns may be coated with a bond metal layer. The bond metal layer may include gold. The plurality of second metal interconnect patterns may be coated with a bond metal layer. The bond metal layer may include gold. The interconnect element may be suitable for heating to a temperature of between 150 and 350° C. The interconnect element may be suitable for exposure to a pressure between 20 and 100 kg/cm$^2$.

In yet further accordance with this aspect of the invention, the plurality of non-hollow metal posts may be joined to the at least some first metal interconnect patterns. The plurality of non-hollow metal posts may be joined using one or more of heat and pressure to the at least some first metal interconnect patterns. Contact areas may be defined wherever ends of the non-hollow metal posts contact the at least some first metal interconnect patterns, and at each such contact area, the first metal interconnect pattern in which that contact area is defined may have its edges outside of the contact area. Contact areas may be defined wherever ends of the non-hollow metal posts contact the at least some second metal interconnect patterns, and at each such contact area, the second metal interconnect pattern in which that contact area is defined may have its edges outside of the contact area.

In accordance with another aspect of the invention, an interconnect element includes a dielectric element having a major surface. Metal interconnect patterns extending in one or more directions of the major surface are embedded in recesses which extend inwardly from the major surface. Outer surfaces of the interconnect patterns are substantially co-planar with the major surface. A projecting conductive film extends over the major surface in at least one direction parallel to a plane defined by the major surface. The projecting conductive film contacts the dielectric element along at least a portion of the major surface and conductively contacts an outer surface of at least one of the metal interconnect patterns.

In accordance with one or more preferred aspects of the invention, the interconnect element may further include an insulating cover film overlying only a portion of the major surface and at least one of the metal interconnect patterns such that the projecting conductive film is exposed by the insulating cover film.

In accordance with one or more preferred aspects of the invention, at least a portion of the projecting conductive film conductively interconnects respective ones of the metal interconnect patterns.

In accordance with a preferred embodiment of the invention, the major surface is a first major surface, the dielectric element includes a second major surface remote from the first major surface and a plurality of second recesses extend inwardly from the second major surface. In such embodiment, the metal interconnect patterns are first metal interconnect patterns embedded in the first recesses, and the interconnect element further includes a plurality of second metal interconnect patterns which extend in one or more directions of the second major surface. These second metal interconnect patterns are embedded in the second recesses, and have outer surfaces that are substantially co-planar with the second major surface. In addition, at least some of the first metal interconnect patterns are conductively connected to at least some of the second metal interconnect patterns.

In accordance with one or more preferred aspects of the invention, at least some of the first metal interconnect patterns are conductively connected to at least some of the second metal interconnect patterns. Connection is provided by one or more conductors which extend through the dielectric element in a direction transverse to the plane defined by the first major surface of the dielectric element.

Preferably, the one or more conductors extending through the dielectric element includes a conductor lining a through hole extending through the dielectric element.

In a particular aspect of the invention, an assembly includes an interconnect element as specified herein and further includes an external circuit element. An exposed lead of such circuit element is inserted into the through hole in conductive contact with the conductor to provide conductive interconnection to the interconnect element.

In accordance with another preferred aspect of the invention, a solid conductive post extends through the dielectric element which contacts inner surfaces of at least some of the first and second metal interconnect patterns, these inner surfaces being recessed inwardly from the first and second major surfaces of the dielectric element.

In accordance with another preferred aspect of the invention, a first insulating cover film overlies a first portion of the first major surface and at least one of the first metal interconnect patterns, such that the projecting conductive film is exposed by the insulating cover film.

An assembly in accordance with a particular aspect of the invention includes an interconnect element as specified herein and an external circuit element. An exposed contact of the external circuit element is conductively connected to the projecting conductive film of the interconnect element.

Preferably, the projecting conductive film is conductively connected to the contact through an anisotropic conductive film.

In accordance with another aspect of the invention, a method is provided for fabricating an interconnect element. In accordance with such method, a structure is provided which includes a first metal layer overlying a second metal layer. A plurality of metal interconnect patterns are patterned from the first metal layer of the structure after which a dielectric element is formed overlying the metal interconnect patterns of the structure. The second metal layer is then removed selectively to the plurality of metal interconnect patterns, such that the plurality of metal interconnect patterns are embedded in the dielectric element and have outer surfaces co-planar with a first major surface of the dielectric element. A projecting conductive film is formed to extend over the first major surface in at least one direction parallel to a plane defined by the major surface so as to contact the dielectric element along at least a portion of the first major surface and conductively contact an outer surface of at least one of the metal interconnect patterns.

Preferably, the step of forming the dielectric element includes pressing a layer including an uncured resin over the plurality of metal interconnect patterns.

In accordance with a particular aspect of the invention, the metal interconnect patterns are first metal interconnect patterns embedded in first recesses extending inwardly from the first major surface. Preferably, the method further includes providing a second structure including a third metal layer overlying a fourth metal layer and patterning a plurality of second metal interconnect patterns from the third metal layer. The step of forming the dielectric element additionally includes pressing the second structure onto a second major surface of the dielectric element remote from the first major surface. The fourth metal layer is then removed selectively to the plurality of second metal interconnect patterns. In this way, the second metal interconnect patterns are embedded in the second major surface of the dielectric element and the second metal interconnect patterns have outer surfaces co-planar with the second major surface. Further in accordance with such aspect of the invention, a through hole is formed to extend through the dielectric element between the first metal interconnect patterns and the second metal interconnect patterns, and a conductor is formed to line the through hole simultaneously when forming the projecting conductive film, such conductor connecting the first metal interconnect patterns to the second metal interconnect patterns.

DETAILED DESCRIPTION

According to certain embodiments of the invention, a multilayer interconnect element or multilayer wiring board is provided wherein metal traces of an interconnection layer are embedded within recesses at the surface of a dielectric element. In addition, the metal traces are formed in such manner that they are much less prone to become twisted, or produce shorts with adjacent interconnections, or break, even when the number of interconnect elements joined together is high. In such embodiments, the surface of each interconnect element presents a substantially planar major surface having conductive contacts thereon for interconnection with other microelectronic elements. In this way, the metal traces do not protrude in ways which interfere with mounting electronic components. Also, improved reliability of the electrical connections may be achieved between several interconnect elements that make up a multilayer interconnect element or multilayer wiring board having three or more layers on which such embedded metal traces are provided. In addition, it may be possible to achieve a reduction in the manufacturing processes required to fabricate such interconnect elements.

Figure 2:
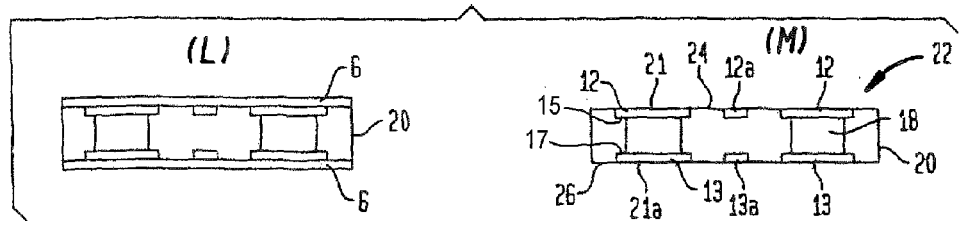
FIGS. 2 (L) through (M) are cross sectional diagrams of a series of processes (L) through (M) according to the first embodiment of the present invention.

In an interconnect element 22 according to an embodiment of the present invention shown in FIG. 2(M), a dielectric element 20, preferably includes one or more thermoplastic resins or consists essentially of one or more thermoplastic resins, where, for example, PEEK (polyether ether ketone) resin, PES resin, PPS (polyphenylene sulfide) resin, PEN (polyethylene napthalate) resin, a PEEK-PES resin polymer blend, and liquid crystal polymers are specific examples of preferred resins. The thickness of the dielectric element is preferably between several dozen and several hundred microns.

Embedded within the dielectric element 20 are first interconnect patterns 12, 12a provided as a first metal wiring layer and second interconnect patterns 13, 13a provided by a second metal wiring layer. The interconnect patterns 12 and 12a are embedded in a plurality of first recesses 15 extending inwardly from a first major surface 24 of dielectric element 20, and interconnect patterns 13 and 13a are embedded in a plurality of second recesses 17 extending inwardly from the second major surface 26 of the dielectric element 20. Each of the first interconnect patterns and the second interconnect patterns includes a plurality of metal traces and contacts or other metallic interconnect features. The thickness of each metal wiring layer is preferably between about 10 microns and several dozen microns. The contacts and metal traces function to provide conductive interconnection between the interconnect element 22 and other microelectronic elements external thereto and/or between different external microelectronic elements. Such microelectronic elements can be, for example, any of microelectronic substrates, circuit panels, integrated circuits ("ICs" or "chips"), packaged chips, i.e., chips having package elements bonded thereto, whether or not such chips include only active circuit elements, passive circuit elements such as commonly known as "integrated passives on chip" (IPOC) or chips having a combination of active and passive types of circuit elements, among others.

A plurality of solid metal posts 18 extend through the dielectric element 20 between the first interconnect patterns 12 and the second interconnect patterns 13. The posts most preferably include or consist essentially of copper. Preferably the posts include high purity copper. The end-to-end length or "height" of each post within the dielectric element 20 is preferably between, for example, several dozen and about 150 microns. However, the height may be somewhat greater than or less than the stated preferred range.

In a particular embodiment a chip, circuit panel or packaged chip is directly or indirectly conductively interconnected to or bonded to interconnection patterns 12, 12a including traces and contacts exposed at a first major surface 24 of the interconnect element 22. On a second major surface 26 of the interconnect element 22 remote from the first major surface 24, contacts 13, 13a of the interconnect element can be further bonded, directly or indirectly, to a circuit panel, another chip, or package element of another packaged chip. In another embodiment, the metal traces on one or both major surfaces 24, 26 of the interconnect element 22 can be contacted by a packaged chip and maintain conductive communication with the packaged chip under a moderate amount of pressure in which some flexing of the dielectric element 20 may occur as a result of the pressure between the interconnect element and the packaged chip.

In an embodiment of manufacturing a multilayer interconnect element or wiring board, heating to a temperature of, for example, between 150 and 350° C. is suitable, and a pressure between 20 and 100 kg/cm$^2$ is preferred. In addition, it is preferable to coat the metal traces exposed at one or both of the first and second major surfaces 24, 26 with a bond metal, especially when electronic components are to be mounted thereto such as integrated circuits (ICs or chips) that have high numbers of terminals with minute pitches. Gold is well suited for use as the bond metal layer 10.

The details of the present invention will be explained based on an embodiment shown in a figure. FIGS. 1(A) through (K) and FIGS. 2(L) through (M) are cross-sectional diagrams showing the sequence of processes (A) through (M) in a first embodiment according to the present invention.

Figure 1:
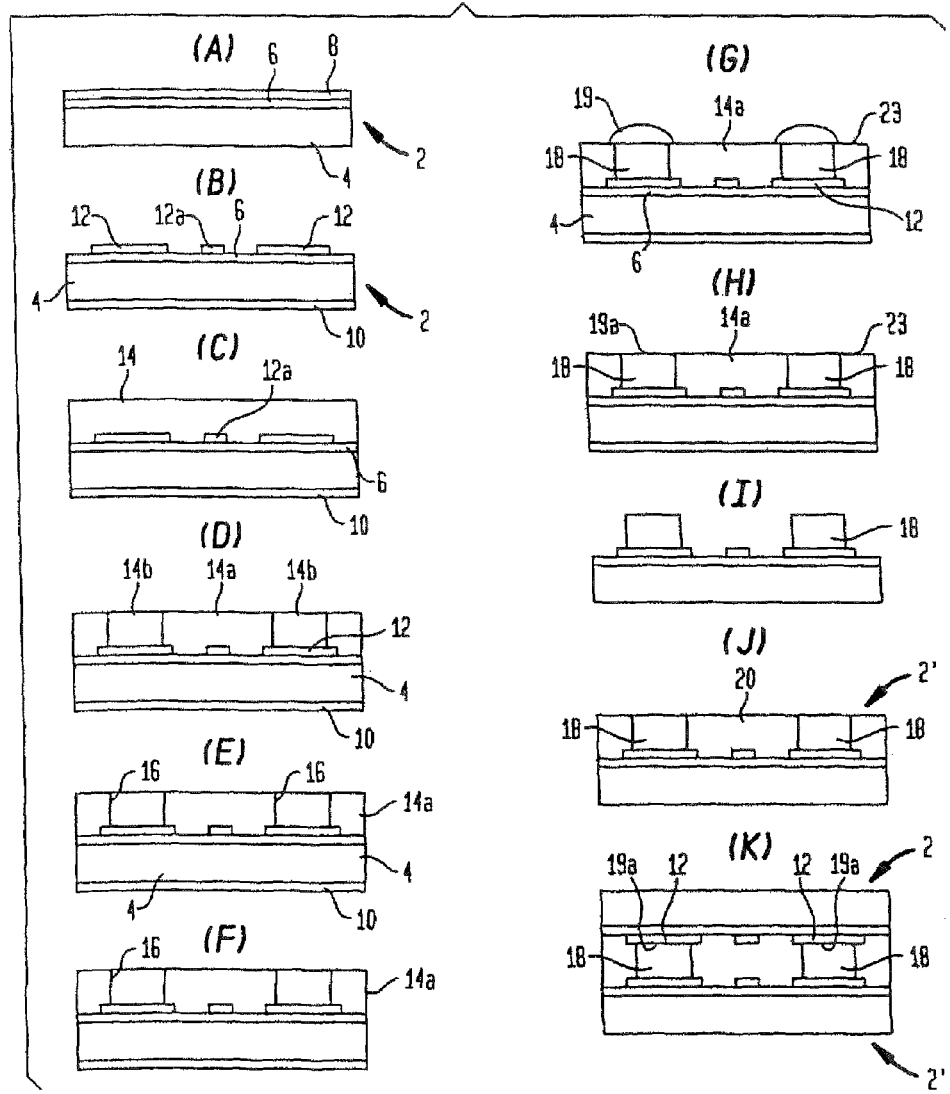
FIGS. 1 (A) through (K) are cross sectional diagrams of series of processes (A) through (K) according to a first embodiment of the present invention.

First, a patternable conductive structure 2, made from a three metal layer structure is prepared as shown in FIG. 1(A). The patternable conductive structure 2 has a three-layer structure wherein, for example, an etching barrier layer (an intermediate layer) 6 including or consisting essentially of a metal such as nickel, for example, is fabricated on the surface of a carrier layer 4 made from, for example, copper, and a metal layer 8 for fabricating an interconnection layer made from, for example, copper, is fabricated on the surface of this etching barrier layer 6.

Following this, as shown in FIG. 1(B), a protective layer 10, made from, for example, photoresist, is provided on the surface of the aforementioned carrier layer 4. Layer 10 protects the carrier layer 4 when the metal layer 8 is patterned, e.g., by photolithography and selective etching to form the interconnection patterns 12. Note that 12a indicates the interconnection patterns which are not conductively metal posts or other electrically conductive pillars extending therefrom.

Following this, as shown in FIG. 1(C), a photoresist layer 14 is fabricated on the surface on which the aforementioned interconnection patterns 12, 12a are fabricated.

Following this, as shown in FIG. 1(D), an exposure process is performed on the aforementioned photoresist layer 14. Following exposure, 14a is the exposed portion, and 14b is the non-exposed portion.

Following this, as shown in FIG. 1(E), a developing process is performed. 16 is a hole that is produced by the developing process.

Following this, as shown in FIG. 1(F), preferably, an after-exposure process is performed. Preferably, the exposure dose in this process is larger than the previous exposure dose with respect to FIG. 1(E). The exposed photoresist is then removed, as by a soft etching process, after which ultrasonic rinsing is preferably performed.

Following this, as shown in FIG. 1(G), the aforementioned patterned resist layer 14a is used as a mask to fabricate metal posts 18 or other electrically conductive pillars as vertically rising features that extend upward from the interconnection patterns 12 within the aforementioned holes 16. Preferably, the posts include or consist essentially of one or more metals, for example, copper, preferably formed by plating. This process is performed so that the electrically conductive pillars 18 preferably have a length or height that extends beyond the major surface 23 of the aforementioned resist layer 14a and ends or tops 19 of the pillars 18 protrude above the resist layer 14a.

Following this, referring to FIG. 1(H), a grinding or polishing process is performed until the ends or tops 19a of the aforementioned electrically conductive pillars 18 are co-planar (i.e., are positioned on the same plane as) with the surface of the resist layer 14a. In such way, after processing the tops 19a present flat surfaces.

Following this, as shown in FIG. 1(I) the aforementioned photoresist layer 14a is removed through stripping, or the like and, at the same time, the aforementioned protective layer 10 is also removed from the surface of the carrier layer 4.

Following this, as shown in FIG. 1(J) a dielectric element, an interlayer insulation layer 20 preferably made from a resin is formed through a method such as pressure adhesion, on the surface whereon the aforementioned electrically conductive pillars 18 are formed. In one embodiment, the interlayer insulation layer includes an uncured resin, such layer being provided in form of an epoxy prepreg, for example. Thereafter, the aforementioned interlayer insulation layer 20 is polished or ground until the end surfaces of the aforementioned electrically conductive pillars 18 are exposed. FIG. 1(J) illustrates a planarized condition of the interlayer insulation layer 20 and the posts in a partly formed first interconnect structure 2' after the grinding process.

Following this, the first such interconnect structure 2', having an insulating layer 20 is formed in the state shown in FIG. 1(J). In addition, a patternable conductive structure 2 is provided which has exposed interconnect patterns 12, as shown in FIG. 1(B). The two structures 2 and 2' are then aligned together so that the end surfaces 19a of the metal posts or electrically conductive pillars 18 contact the interconnect patterns 12 of structure 2. Pressure and heat are then applied to join and bond the metal posts 18 to the interconnect patterns of the opposing conductive structure 2. FIG. 1(K) shows the state after this integration.

This joining process connects the metal posts 18 to the interconnect patterns, doing so through metal-to-metal bonding of the posts 18 to the interconnect patterns 13 and 13, especially via copper-to-copper contact. This process integrates the two structures 2 and 2' into a single unit.

Following this, as shown in FIG. 2(L), the respective carrier layers 4 and 4 (FIG. 1(A)) are removed through, for example, etching.

Following this, as shown in FIG. 2(M), the aforementioned etching barrier layers 6 and 6, made from nickel, are removed through, for example, etching.

Given this type of method for manufacturing, an interconnect element or wiring board is fabricated wherein the interconnection layer and the insulating layer are co-planar as shown in FIG. 2(M), fabricated such that outer surfaces 21 of the interconnect patterns 12 and 12a are co-planar with the first major surface 24 and the outer surfaces 21a of the interconnect patterns 13, 13a are co-planar with the second major surface 26.

FIGS. 3(A) through (H) and FIGS. 4 (I) through (M) are cross-sectional diagrams showing a series of processes (A) through (M) in a second embodiment according to the present invention.

Figure 3:
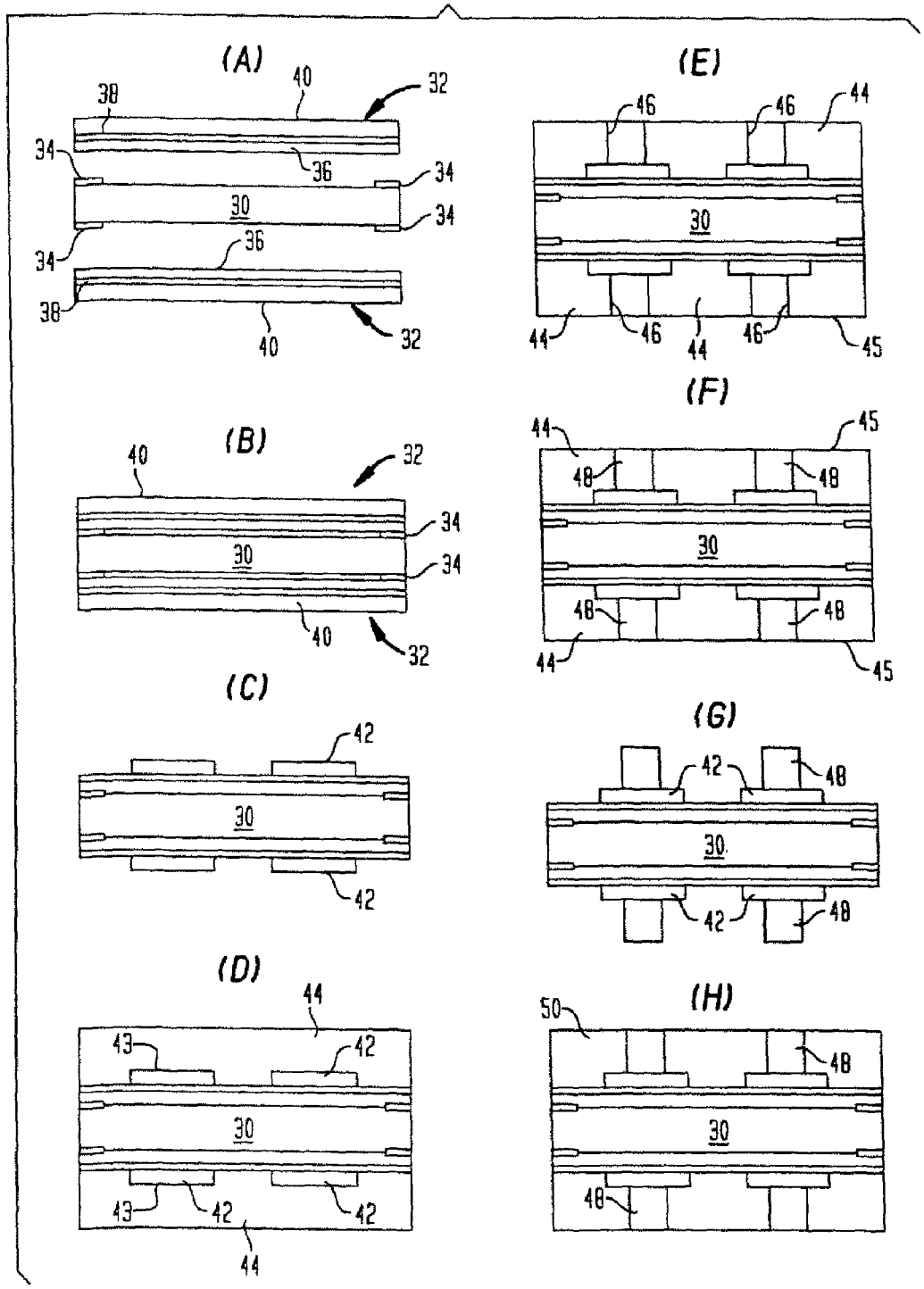
FIGS. 3 (A) through (H) are cross sectional diagrams illustrating a process according to a second embodiment of the present invention.
Figure 4:
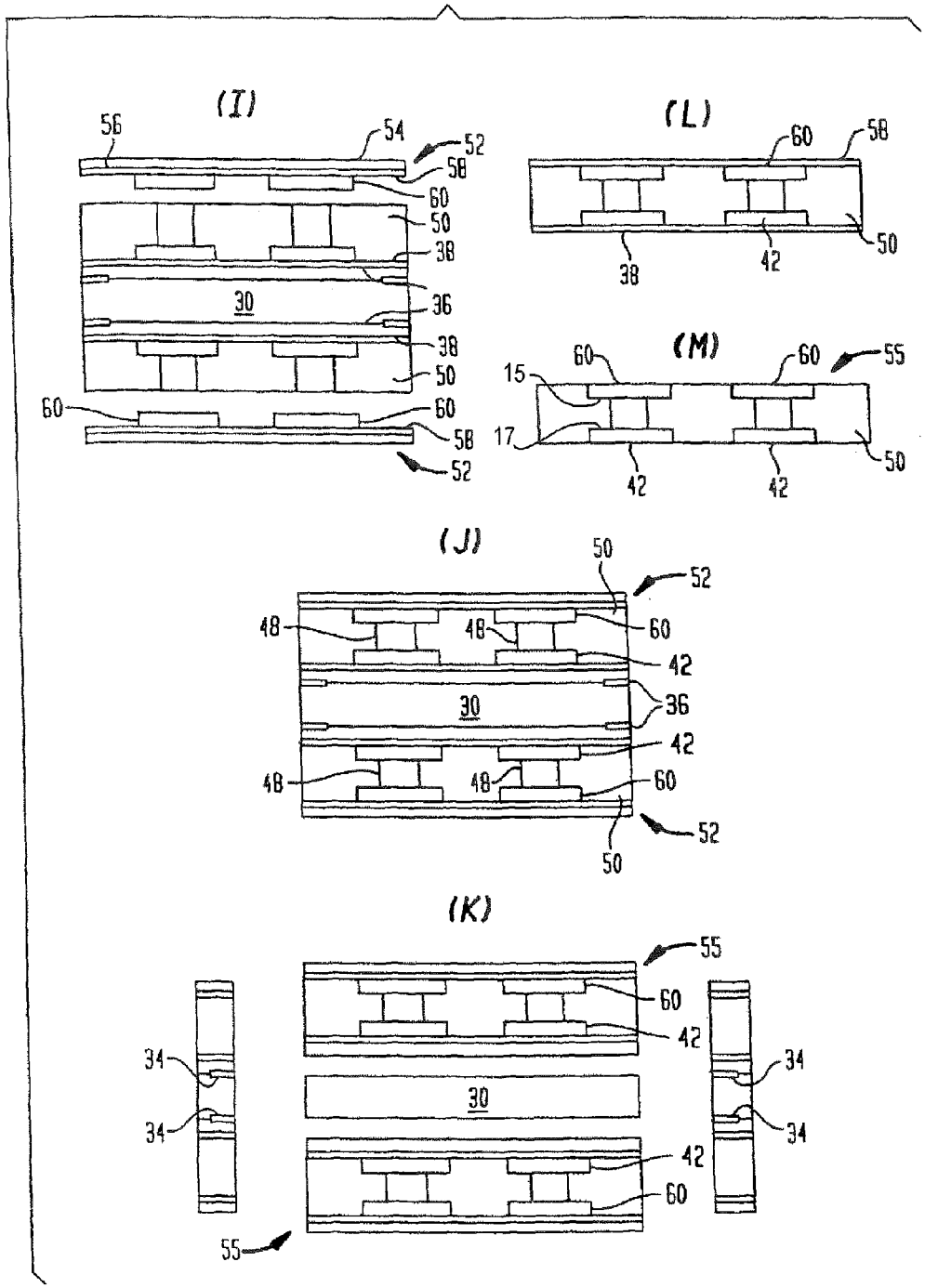
FIGS. 4 (I) through (M) are cross sectional diagrams further illustrating a process according to the second embodiment of the present invention.

As shown in FIG. 3(A), two patternable conductive structures 32 and 32, and a core 30, are prepared, the core being made from, for example, a resin. An adhesive sheet 34, made from, for example, a prepreg, or the like, is formed on a part of both sides of this core 30, the prepreg being made from, for example, an epoxy resin. The core 30 will be removed later as being an unneeded area.

Note that each of the aforementioned patternable conductive structures 32 have three-layer structures wherein a metal layer 40 for fabricating an interconnection layer including or consisting essentially of copper, for example, overlies an etching barrier layer (an intermediate layer) 34, which includes or consists essentially of a metal that would not be attacked by an etchant which attacks the first metal. For example, when the first metal includes or consists essentially of copper, and the etching barrier layer can include or consist essentially of nickel. Copper can be etched by an etchant which substantially does not attack nickel. In turn, the first metal 40 and the etching barrier layer 34 are provided on or overlying a surface of a carrier layer 36 made from, for example, copper. The patternable conductive structure is preferably fabricated through rolling, although other methods can be used.

Following this, as shown in FIG. 3(B), the patternable conductive structures 32 and 32 are adhered, through the aforementioned adhesive sheet 34, to both surfaces of the core material 30, such that the metal layer 36 which is the carrier faces the surface of the core material 30. This adhesive sheet 34 is disposed at one or more locations of the patternable conductive structures away from locations where interconnect patterns are to be formed (the active region). Thus, the adhesive sheet 34 is disposed preferably only in an unneeded region.

Following this, as shown in FIG. 3(C), interconnection layers 42 are formed through selectively etching the metal layers 40 of each of the aforementioned patternable conductive structures 32 and 32.

Following this, as is shown in FIG. 3(D), photoresist layers 44 are deposited over surfaces 43 of both of the interconnection layers 42. These resist layers 44 are formed with a thickness that is essentially at the same height as the end surface of the electrically conductive pillars 48 (FIG. 1(F)) to be formed, or with a surface that is slightly lower.

Following this, as is shown in FIG. 3(E), each of the aforementioned resist layers 44 are patterned, such as by photolithography, to form the holes 46.

Following this, as is shown in FIG. 3(F), metal posts 48 or other electrically conductive pillars 48 are fabricated within the holes of the resist layer 44. Preferably, the posts are fabricated by plating with a metal such as copper, for example, using the aforementioned resist layers 44 as masks. The fabrication of these electrically conductive pillars 48 may be performed through overplating, as appropriate, to an extent that the metal posts 48 extend beyond the major surfaces 45 of the interlayer insulation layers 44 such as in the above-described embodiment shown in FIGS. 1(A)-1(K) and FIGS. 2(L)-2(M). Thereafter, grinding or polishing is performed to cause the outer surfaces of the electrically conductive pillars 48 to be co-planar with the major surfaces 45 of the interlayer insulation layer 44.

Following this, as shown in FIG. 3(G), each of the aforementioned resist layers 44 is removed.

Following this, as shown in FIG. 3(H), interlayer insulation layers 50 are formed on each of the surfaces whereon the interconnection layers 42 and the electrically conductive pillars 48 are fabricated. These insulation layers are formed, for example, by a pressure adhesion method, after which the end surfaces of the aforementioned electrically conductive pillars 48 are exposed through grinding the aforementioned interlayer insulation layers 50.

Following this, as shown in FIG. 4(I), interconnect structures 52 and 52 are aligned and overlaid over each of the aforementioned interlayer insulation layers 50 and 50.

Each of the aforementioned interconnection structures 52 and 52 includes an interconnection layer including interconnection patterns 60. The interconnection layer may include or consist essentially of copper, for example. In turn, the interconnection layer overlies an etching barrier layer (an intermediate layer 56), made from, for example, nickel. The etching barrier layer, in turn, overlies a carrier layer 54, made from, for example, copper. Moreover, each of these interconnection structures 52 and 52 are oriented so that the sides whereon the interconnect patterns 60 are formed are facing each of the interlayer insulation layers 50 and 50, and are provided aligned so that the various electrically conductive pillars 48 will be lined up with the corresponding interconnection layers 60.

Following this, as shown in FIG. 4(J), the interconnect structures 52 and 52 are aligned and joined with the aforementioned interlayer insulation layers 50 and 50 through the application of heat and pressure. Consequently, the various electrically conductive pillars 48 integrated, through metal-to-metal bonding, for example, copper-copper bonding, with the corresponding interconnection layers 60. In addition, the interlayer insulation layer 50 becomes joined to the structure 52.

Following this, as shown in FIG. 4(K), that which was integrated in FIG. 4(J) is cut at the part wherein the aforementioned adhesive 34 is adhered, to separate the unneeded core 30 from the active region, the active region being the two interconnect elements 55 each having a first interconnection layer 42 and a second interconnection layer 60 on a side of the interconnect element 55 remote from the first interconnection layer 42.

Following this, the aforementioned carrier layers 54 (FIG. 4(I)) and 36 (FIG. 4(I)) are removed from the interconnect element 55. FIG. 4(L) shows the state after these carrier layers 54 and 36 have been removed.

Following this, each of the aforementioned etching barrier layers 58 and 38 FIG. 4(L) are removed as shown in FIG. 4(M).

This type of method for manufacturing fabricates an interconnect element 55 or a wiring board such as shown in FIG. 4(M) wherein interconnect patterns 60 and 42 are provided as metal patterns embedded in first recesses 15, and second recesses 17 in the first and second major surfaces of the interlayer insulation layer 50, respectively so that the outer surfaces of the interconnect patterns and those major surfaces are co-planar.

Furthermore, because the fabrication processes for the two interconnect elements or wiring boards progress simultaneously for both sides until the interconnect elements are separated from the core material 30, this can improve the manufacturing efficiency and can increase the productivity.

FIGS. 5(H) through (K) are cross-sectional diagrams illustrating the series of processes for simultaneously fabricating two interconnect elements in a variation of the embodiment shown in FIGS. 3(A)-3(H) and FIGS. 4(I)-4(M).

Figure 5:
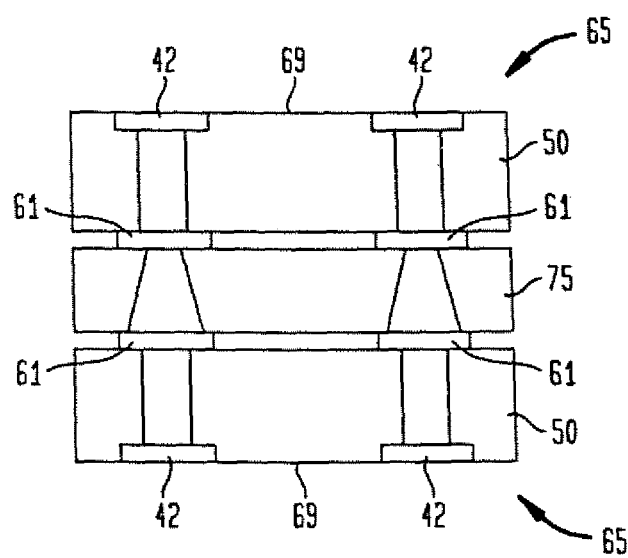
FIGS. 5 (H) through (K) are cross-sectional diagrams illustrating a process according to a variation of the second embodiment of the present invention.

In this embodiment, the same structure as shown in FIG. 3(H) is prepared, according to the processing described above relative to FIGS. 3(A)-3(H). Thereafter, the processes differ from the embodiment described above relative to FIGS. 4(I)-4(M). FIG. 5(H) illustrates the same structure as that shown in FIG. 3(H).

Following this, as shown in FIG. 5(I), metal layers and 59 are provided on opposite sides of the core material 30. The metal layers including or consisting essentially of, for example, copper, are joined, bonded or adhered to the interlayer insulation layers 50 and 50 through the application of heat and pressure. Doing so causes the parts of the metal layers 59 and 59 to form secure connections having excellent conductivity to the metal posts or electrically conductive pillars 48 and 48, because the conductive connections are made through metal-to-metal contact, e.g., copper-copper bonding. In addition, other parts of the metal layers 59 and 59 adhere well to outer surfaces of the interlayer insulation layers 50 and 50.

Following this, as shown in FIG. 5(J) interconnect patterns 61 and 61 are fabricated through patterning, e.g., photolithographically patterning an overlying mask layer and selectively etching the aforementioned metal layers 59 and 59 from within openings in that mask layer.

Following this, in the same manner as shown and described above relative to FIG. 4(K), cutting is performed in the unneeded region part adhered by the adhesive sheet 34, after which the former carrier layers 36 and 36 (FIG. 4(I)) are removed. During such process, the etching barrier layers 38 (FIG. 4(I)) whereon the interconnection layers 61 and 61 are formed are used as masks. Finally, the etching barrier layers 38 can be removed to provide a pair of interconnect elements 65 joined together via adhesive layers 36 and a core 30. These interconnect elements 65 can then be separated from the core as described above relative to FIG. 4(M) to provide a pair of interconnect elements 65 joined together via adhesive layers 36 and a core 30. These interconnect elements 65 can then be separated from the core as described above relative to FIG. 4(K).

When this is done, first interconnect patterns 61, overlying one major surface 63 of the interlayer insulation layer (dielectric element), protrude above the major surface of the interlayer insulation layer 50, as shown in FIG. 5(J). On the other hand, although there are indentations and protrusions on one major surface 63 of the interlayer insulation layer 50, the metal interconnect patterns 42 are embedded in the other major surface 67 of interlayer insulation layer 50 so that outer surfaces 69 of those interconnect patterns 42 are co-planar with that major surface 67. Accordingly, an interconnect element or a wiring board of a double-sided interconnection type is provided.

Following this stage of fabrication, as shown in FIG. 5(K), the interconnect elements 65 can be joined together in a multilayer interconnect element having a different arrangement, e.g., through a central connecting element other than the above-described core 30. In one example, the interconnect elements 65 are joined together through heat and pressure to opposite sides of a dielectric connecting element 75 or "core connector." Such core connector 75 may or may not have conductive patterns on metallic or conductive posts, vias or metallic connectors extending vertically therethrough. In a particular example, the protruding interconnect patterns 61 face inward, i.e., toward the dielectric connecting element, and the interconnect patterns 42 face outward. In this way, the interconnect patterns 42, which are co-planar with the exposed major surfaces of the dielectric elements 50 face outward. In such case, the aforementioned interconnect element or a wiring board is well suited to manufacturing a multilayer interconnect element 65 or wiring board having embedded interconnect patterns 42 such that it is flat on its outermost surfaces 69.

FIGS. 6(A) through (D) are cross-sectional diagrams showing the series of processes in a third embodiment according to the present invention.

Figure 6:
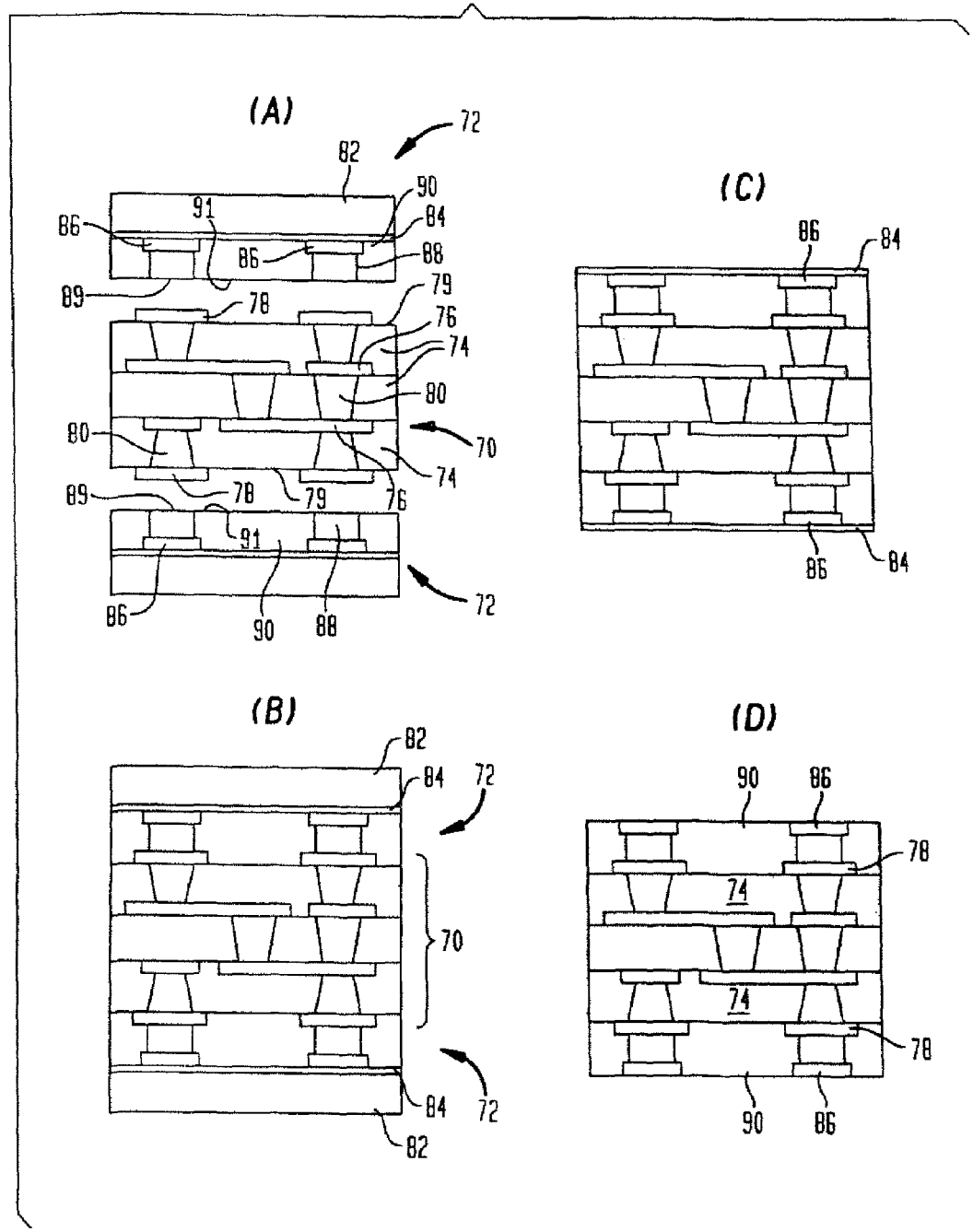
FIGS. 6 (A) through (D) are cross-sectional diagrams illustrating a series of processes in a third embodiment according to the present invention.

As is shown in FIG. 6(A), a core substrate 70, and two outer interconnect elements 72 and 72 are provided which face opposite (front and rear) surfaces of the core substrate 70. The core substrate 70, in the present example, has four interconnect layers, where 74 is an interlayer insulation layer, 76 are inner interconnect patterns 78 are outer interconnect patterns, and 80 is a bump for interlayer connections, where the outer interconnect patterns 78 protrude above the outer major surfaces 79. Thus, the outer (major) surfaces 79 have protrusions and indentations.

Each of the aforementioned outer interconnect elements 72 and 72 includes interconnect patterns 86, which include or consist essentially of a metal such as copper which overlies an etching barrier layer 84. The etching barrier includes or consists essentially of a material such as, for example, nickel, which is not attached by an etchant which attacks the metal from which interconnect patterns 86 are made. The etching barrier layer 84, in turn, overlies a carrier layer 82, preferably including or consisting essentially of copper. A plurality of metal posts or electrically conductive pillars 88, preferably including or consisting essentially a metal such as copper extend from the interconnect patterns 86. An interlayer insulation layer 90 covers an inner surface of the interconnect patterns 86 and fills a space between the electrically conductive pillars 88. End surfaces 89 of the electrically conductive pillars 88 are exposed at an outer surface 91 of the interlayer insulation layer 90.

Furthermore, on both surfaces of the core substrate 70, interconnect elements 72 and 72 are positioned, oriented so that the end surfaces 89 of the electrically conductive pillars 88 and 88 and the outer surface 91 of the interlayer insulation layer 90 are facing the core substrate 70. The interconnect elements and the core substrate are aligned so that each of the electrically conductive pillars 88 and 88 line up with the positions of each of the outer interconnect patterns 78 and 78 of the core substrate 70.

Following this, heat and pressure are applied to join, e.g., bond, adhere or fuse the aforementioned interconnect elements 72 and 72 onto the exposed surfaces of dielectric layers and interconnect patterns 78 of the aforementioned core substrate 70. FIG. 6(B) shows the state after this joining process.

This joining process not only strongly connects the end surfaces of each of the electrically conductive pillars 88 and 88 to the outer interconnect patterns 78 of the core substrate 70 through copper-copper bonding, but also integrates, adheres, bonds or preferably fuses the interlayer insulation layers 74 and 90 to each other.

Following this, as shown in FIG. 6(C), the aforementioned carrier layers 82 and 82 (FIG. 6(B)) are removed through etching, or the like, using, for example, an etchant that etches the material of the carrier layer, e.g., copper, without attacking the material of the etching barrier layer 84, which is preferably nickel.

Following this, the aforementioned etching barrier layers 84 are removed through, for example etching, as shown in FIG. 6(D). When this is done, this can provide a multilayer interconnect element or wiring board having six layers of interconnection layers, where the interconnect patterns of each interconnection layer are co-planar with the outer surfaces of each insulation layer.

This type of method for manufacturing can provide a multilayer interconnect element or wiring board wherein the outermost surfaces are flat and in which interconnect patterns are embedded in and are co-planar with those outermost surfaces. Such method utilizes a core substrate 70 as a base, which has indentations and protrusions on the surfaces thereof, due to the interconnection layers 78. Thereafter, the aforementioned interconnect elements 72 and 72 are aligned and joined thereto so that the electrically conductive pillars and the exposed surfaces 91 of the interlayer insulation layers 90 face inward toward the core substrate 70, and so that the interconnect patterns 86 and 86 face outward.

Note that although in the embodiment described above, the number of layers for the core substrate 70 is four, and the number of layers in the multilayer interconnect element or wiring board produced therefrom is six, this is only a single example. The number of layers in the core substrate 70 is not limited to four, but rather may be a different number of layers, enabling the provision of a multilayer wiring board having a number of layers that is two layers more than the number of layers in the core substrate 70.

FIGS. 7(A) through (H) and FIGS. 8(A) through (H) are cross-sectional diagrams showing a fourth embodiment according to the present invention. FIGS. 7(A) through (H) illustrate a series of processes for the method of manufacturing an interconnect element 111 (FIG. 7(H)) to be used at outermost layers of a multilayer interconnect element or wiring board. FIGS. 8(A) through (H) illustrate a series of processes for processing a core interconnect element or wiring board for integrating the aforementioned interconnect elements 111 with a core wiring board, and for finishing the multilayer wiring board by further processing the interconnect elements 111.

First, the method for manufacturing the interconnect elements 111 will be explained with reference to FIGS. 7(A) through (H).

Figure 7:
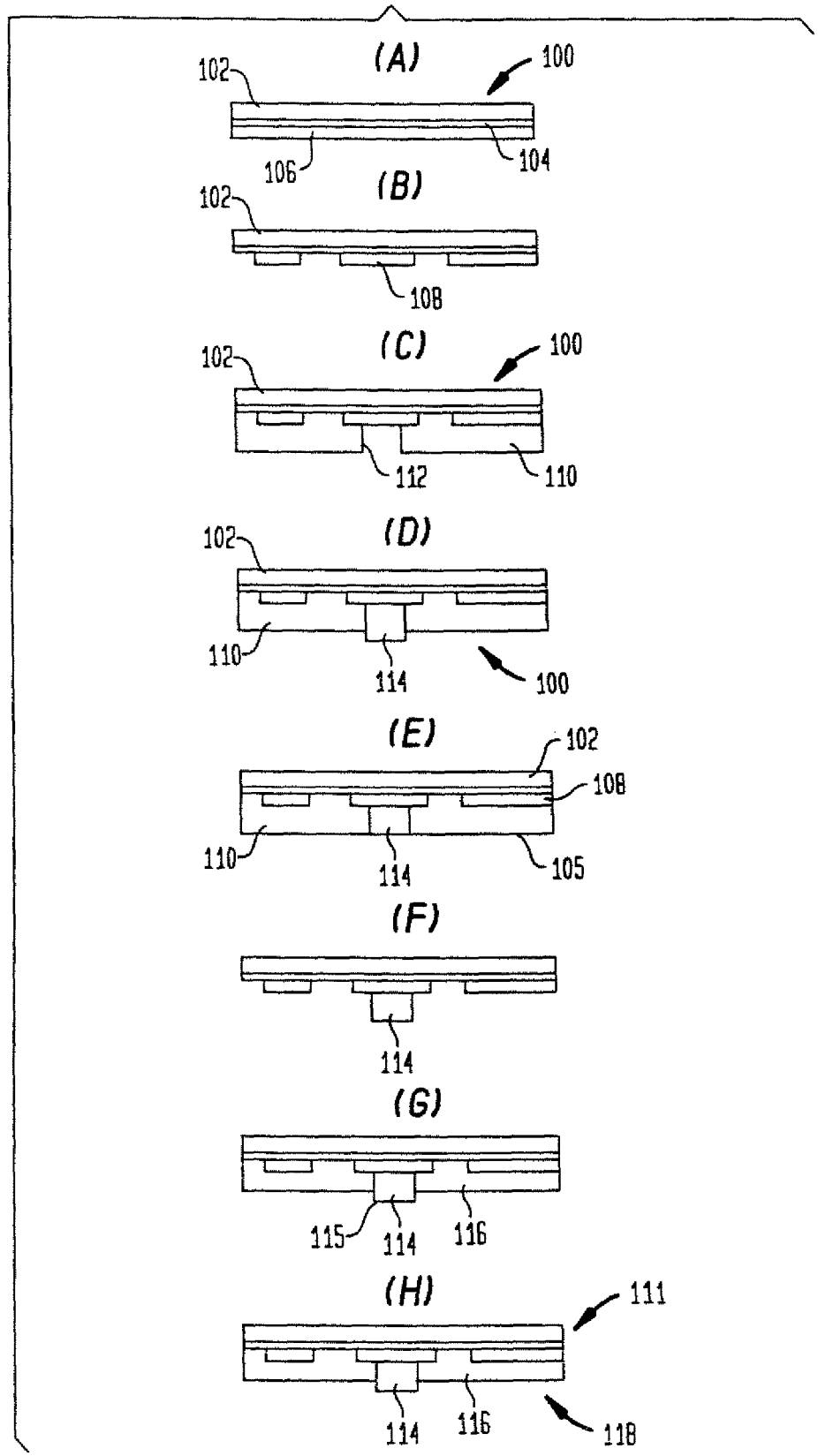
FIGS. 7 (A) through (H) are cross-sectional diagrams illustrating a series of processes in a method for manufacturing an interconnect element for an outermost layer according to a fourth embodiment of the present invention.

As is shown in FIG. 7(A), a three-layer metal structure 100 is prepared in a manner such as described above relative to the structure 2 shown in FIG. 1(A). This three-layer metal structure includes a metal layer 106 to be fabricated into interconnect patterns, made from, for example, copper. Such layer 106 overlies an etching barrier layer 104 made from, for example, nickel, on one surface of a carrier layer 102, made from, for example, copper. The structure 100 may be fabricated through, for example, rolling.

Following this, as is shown in FIG. 7(B), interconnect patterns 108, including traces, contacts, etc., for example, are fabricated through selectively etching the aforementioned metal layer 106 (FIG. 7(A)).

Following this, on the exposed surfaces of the aforementioned interconnect patterns 108, as is shown in FIG. 7(C), a resist layer 110 is deposited and patterned, such as through photolithography. 112 is a hole that is formed in the aforementioned resist layer 110, and a metal post or electrically conductive pillar 114 (FIG. 7(D)), described below, will be formed in this hole 112.

Following this, as shown in FIG. 7(D), the electrically conductive pillar 114 is fabricated preferably by plating a metal such as, for example, copper, using the aforementioned resist layer 110 as a mask. In this case, the electrically conductive pillar 114 is fabricated so as to protrude slightly from the surface of the resist layer 110. This is to make it possible in a subsequent grinding process, to align the tops of the electrically conductive pillars 114 to a specific height, despite variability in the plating process.

Following this, as is shown in FIG. 7(E), the protruding parts of the aforementioned electrically conductive pillars 114 are ground to cause the end surfaces thereof to be coplanar with (i.e., to be on the same plane as) the outer (major) surface 105 of the resist layer 110.

Following this, as is shown in FIG. 7(F), the aforementioned resist layer is removed.

Following this, as is shown in FIG. 7(G), an interlayer insulation layer 116 is provided overlying the aforementioned interconnect patterns 108 and insulating respective ones of the aforementioned electrically conductive pillars 114. After this stage of processing, the tops or ends 115 of the electrically conductive pillars 114 are exposed.

Following this, the ends of the aforementioned electrically conductive pillars 114 are polished or ground to adjust the height and to planarize them to the surface of the interlayer insulation layer 116, to complete the interconnect element 118, as shown in FIG. 7(H).

Note that two of these interconnect elements 118 are prepared, and provided according to the processes shown in FIG. 8(A) through 8(H).

The method for manufacturing to provide a multilayer interconnect element or wiring board according to the present embodiment will be explained next with reference to FIGS. 8(A) through (H).

Figure 8:
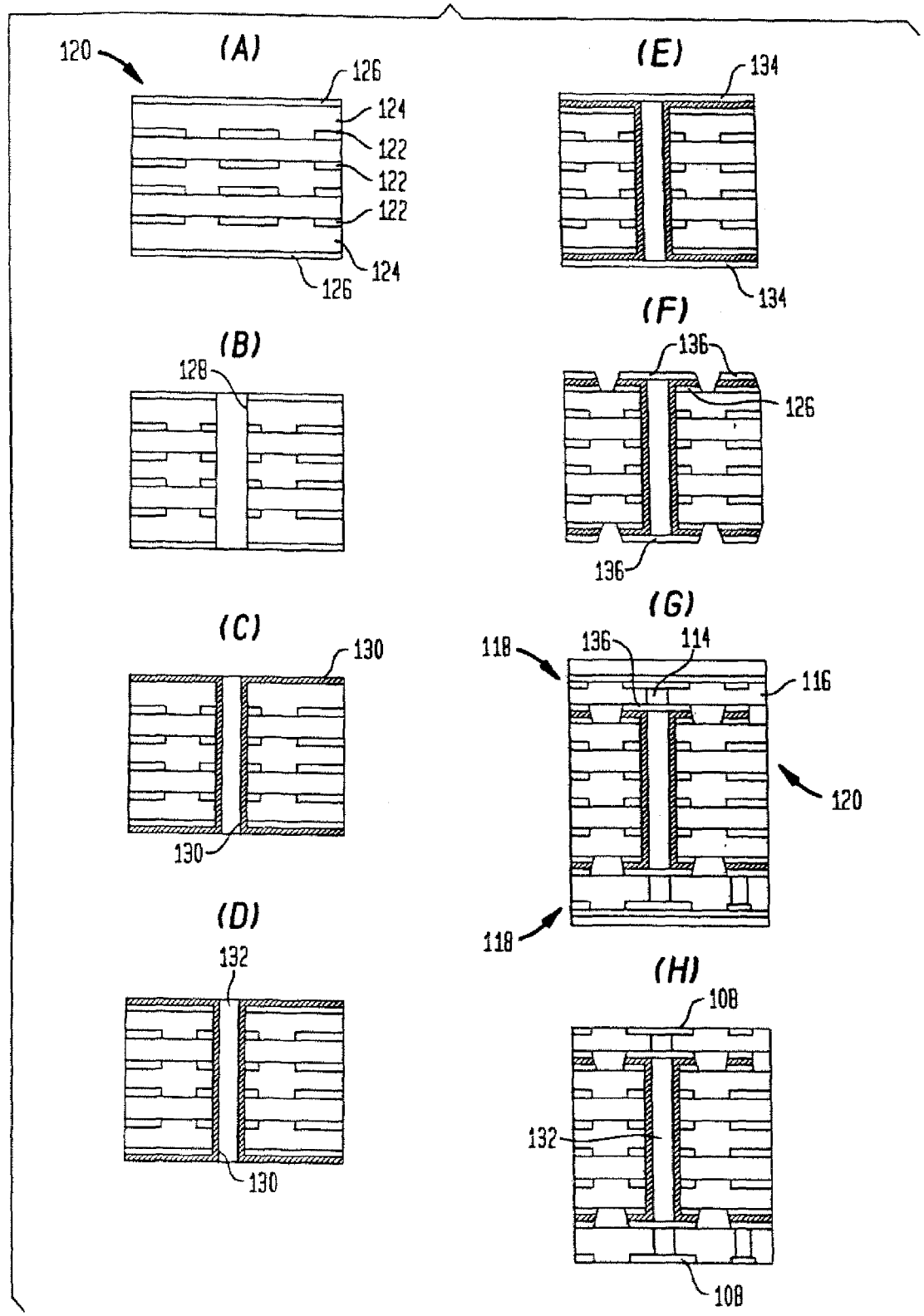
FIGS. 8 (A) through (H) are cross-sectional diagrams showing the series of processes for processing a core wiring board, for integrating interconnect elements for outermost layers with this core wiring board, and for finishing a wiring board through processing the interconnect elements for outermost layers, according to such fourth embodiment.

First, as shown in FIG. 8(A), a core interconnect element or core wiring board 120 is provided.

In this core interconnect element 120, four interconnection layers 122 are provided on the inside thereof, each separated and insulated from others of the layers 122 by interlayer insulation layers 124. Metal layers 126 and 126 are provided on the outermost surfaces.

Following this, as shown in FIG. 8(B), through holes 128 are formed extending from the outermost surfaces through the aforementioned core interconnect element 120.

Following this, as shown in FIG. 8(C), a through hole interconnection layer 130 is fabricated by plating a metal such as copper, for example, using electroless plating or electroplating. The interconnection layer 130 is formed on the surface of the core interconnect element 120, including the surface of the aforementioned through hole 128.

Following this, as shown in FIG. 8(D), the holes on the inside of the aforementioned through hole interconnection layer 130 are filled with an electrically conductive paste or an insulating paste 132, after which the parts of this electrically conductive past or insulating paste 132 protruding at the top and the bottom are polished or ground to eliminate protrusions and indentations.

Following this, a metal layer 134, including or consisting essentially of a metal such as copper, for example, is fabricated on the surface, as shown in FIG. 8(E) by electroless plating and/or electroplating.

Following this, as is shown in FIG. 8(F), an interconnection layer 136 is fabricated through selectively etching the aforementioned metal layer 134 (FIG. 8(E)), the through hole interconnection layer 130, and the metal layer 126.

Following this, as shown in FIG. 8(G), the aforementioned interconnect elements 118 and 118, manufactured using the method shown in FIGS. 7(A)-7(H), are aligned and joined to the exposed surfaces of the aforementioned core substrate 120.

The interconnect elements 118 and 118 are arranged so that the ends of the electrically conductively pillars 114 and the interlayer insulation layers 116 face the exposed surfaces of the interconnection layer 136 of the core interconnect element 120. The interconnect elements are aligned so that each of the electrically conductively pillars 114 are lined up with the interconnection layers 136 corresponding thereto. Thereafter, pressure and heat are applied to bond, adhere or fuse the interconnect elements 118 to the core interconnect element 120.

Following this, the carrier layers 102 and 102 (FIG. 7(A)) of the aforementioned interconnect elements 118 and 118 are removed, following which the etching barrier layers 104 and 104 (FIG. 7(A)) are removed. FIG. 8(H) shows the state after these etching barrier layers have been removed.

This method of manufacturing produces a multilayer interconnect element or wiring board that has through holes for electrical connection between layers thereof and which has flat outer surfaces.

FIGS. 9(A) through (I) are cross-sectional diagrams showing the sequence of processes in a fifth embodiment of the present invention.

Figure 9:
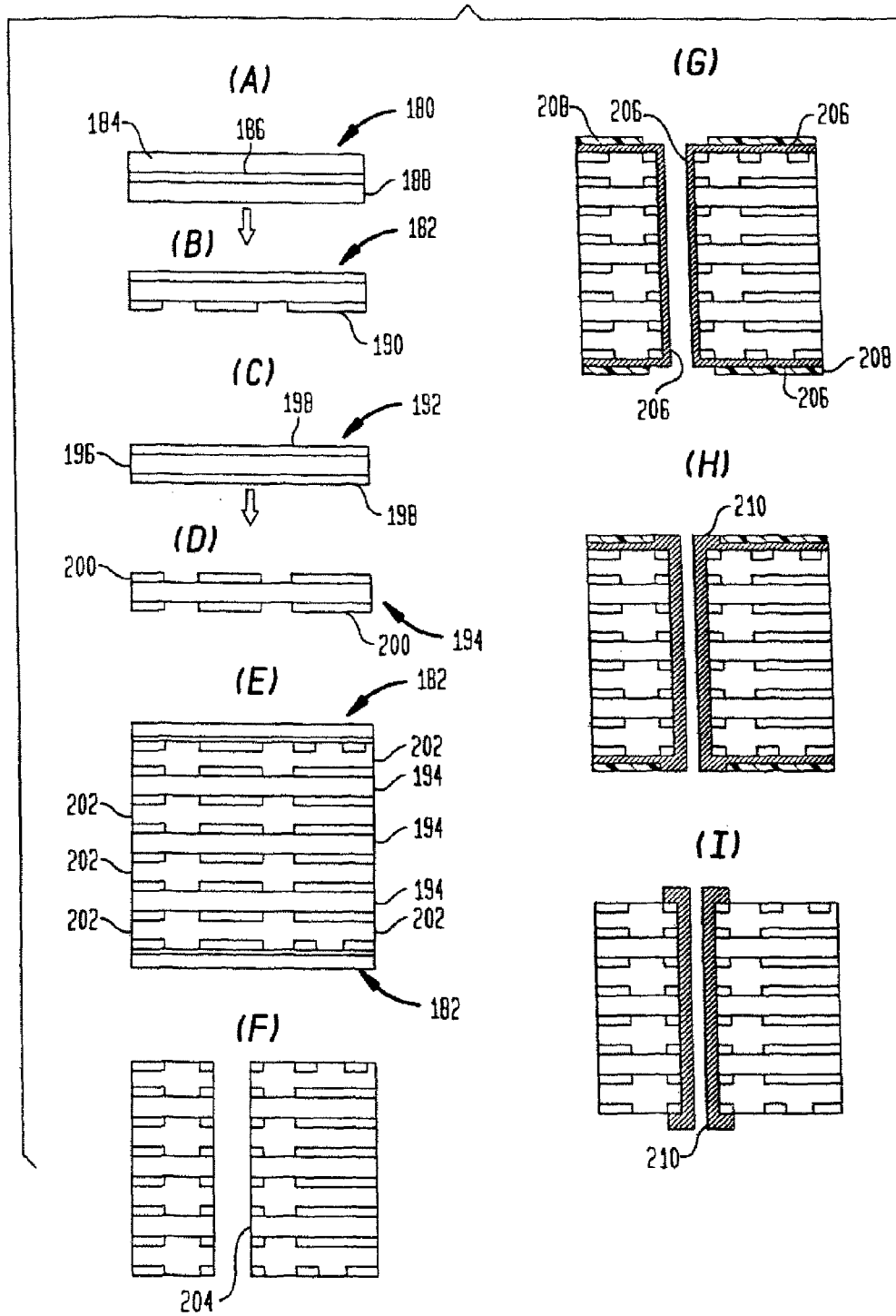
FIGS. 9 (A) through (I) are cross-sectional diagrams showing a series of processes in a fifth embodiment according to the present invention.

First, referring to FIGS. 9(A)-9(B), two interconnect elements used for the outermost layers of the wiring board are prepared. Referring to FIGS. 9(C)-9(D), one or more interconnect elements used for intermediate layers are prepared.

First the interconnect elements 182 (FIG. 9(B)) for the outermost layers are prepared. For ease of reference, only a single interconnect element 182 is shown.

This interconnect element 182 can be made through preparing a three-layer metal structure 180 (FIG. 9(A)) wherein a metal layer 188, including or consisting essentially of a metal such as copper, for example, is provided, overlying an etching barrier layer 186, including or consisting essentially of a metal, which is not attacked by an etchant which attacks the first metal, e.g. copper. The metal of which the etching barrier layer is formed may be nickel, for example. Such layer 186 overlies one surface of a carrier layer 184 including or consisting essentially of a metal, such as copper, for example. The metal layer 188 is patterned, e.g., by photolithographic process to produce an interconnection layer 190 including interconnect patterns such as traces, contacts, etc.

Referring to FIGS. 9(C)-9(D), an interconnect element 194 for an intermediate layer is prepared. Although in FIG. 9(D) only one interconnect element 194 for an intermediate layer is shown, a plurality thereof may be provided. Illustratively, in the present embodiment, three are provided. Each interconnect element 194 for an intermediate layer can be produced through preparing a three-layer structure 192 wherein metal layers 198 are fabricated on both sides of an interlayer insulation layer 196 (FIG. 9(C)), and these metal layers 198 on both sides are then patterned, such as by photolithographic processes.

Following this, a plurality, or in the example as specifically shown, three interconnect elements 194 are stacked with interlayer insulation layers 202 interposed there between, after which the aforementioned interconnect elements for the outermost layers 182 are stacked at specific positions on both outside surfaces of the stack. Thereafter, heat and pressure are applied to join the interconnect elements 182 as outermost layers with the interconnect elements 194 disposed between them to join the components 202, 194, 194, 194, and 202. FIG. 9(E) shows the state after these components have been joined.

Following this, the carrier layers 184 (FIG. 9(A)) are removed from the outermost surfaces of the layered unit that has been integrated as described above, after which the etching barrier layers 186 are removed, following which through holes 204 are provided in specific locations. FIG. 9(F) shows the state after the through holes 204 have been formed.

Following this, a plated underlayer 206, including or consisting essentially of a metal such as copper, for example is fabricated by electroless plating on the surface of the aforementioned layered unit, including the inner peripheral surface of the aforementioned through holes 204, after which a resist layer 208, which will serve as the mask layer for through hole fabrication, is deposited and patterned, e.g. by photolithography. FIG. 9(G) shows the state after the fabrication of this resist layer 208.

Following this, as shown in FIG. 9(H), the aforementioned resist layer 208 is used as a mask to fabricate a through hole interconnection layer 210, including or consisting essentially of a metal such as copper, for example on top of the aforementioned plated underlayer 206. Note that the fact that the inner peripheral surface of the aforementioned through hole interconnection layer 210 may be filled with an electrically conductive paste or an insulating paste 132 is the same as the case of the embodiment shown in FIG. 8(D).

Following this, the aforementioned resist layer 208 (FIG. 9(G) is removed, and the aforementioned plated underlayer 206 is also removed to expose the interconnection layer 190. This can provide a multilayer wiring board that uses the through hole interconnection layer 210 as an interlayer connection means to enable greater levels of integration by allowing a great number of intermediate interconnect elements 195 each having an interconnection layer to be joined and electrically connected together in one multilayer interconnect element.

FIGS. 10(A) through (H) are cross-sectional diagrams of a series of processes according to a sixth embodiment of the present invention.

Figure 10:
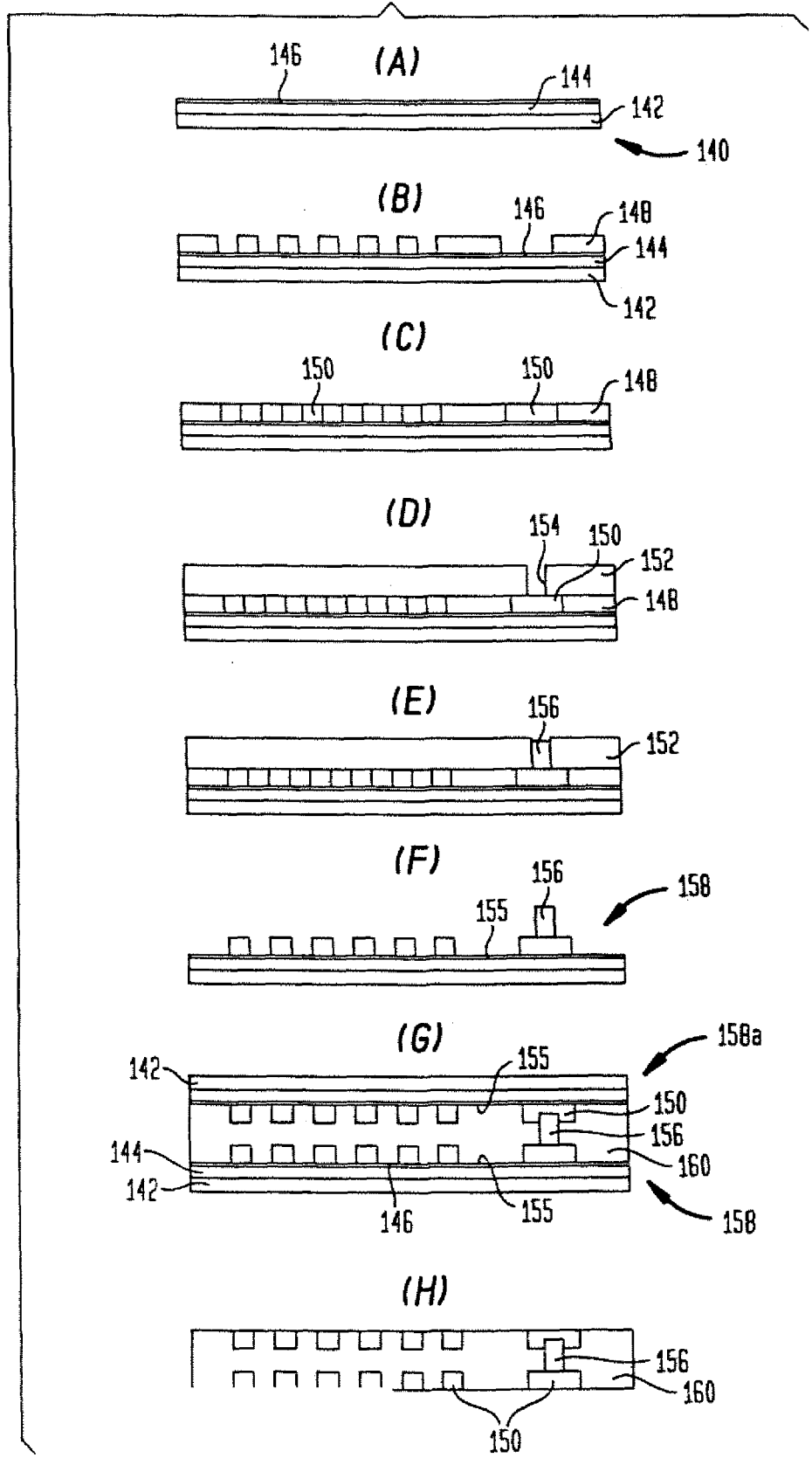
FIGS. 10 (A) through (H) are cross-sectional diagrams showing a series of processes in a sixth embodiment according to the present invention.

As is shown in FIG. 10(A), a three-layer metal structure 140 is prepared. This three-layer metal structure 140 has a metal underlayer 146, including or consisting essentially of a metal such as copper, for example, layered on top of an etching barrier layer 144 including or consisting essentially of a metal such as nickel, for example. The etching barrier layer in turn overlies a surface of a carrier layer 142, which includes or consists essentially of a metal such as copper, for example. The metal structure 140 may be fabricated through rolling, for example.

Following this, as shown in FIG. 10(B), a first photo-resist layer 148 is deposited and patterned over the aforementioned metal structure 140. Following this, as shown in FIG. 10(C), an interconnection layer 150 including metal interconnect patterns, e.g., traces and/or contacts is fabricated through plating a metal, for example, copper, using the aforementioned resist layer 148 as a mask, after which a surface roughening process is performed for roughening the surface of this interconnection layer 150.

Following this, as shown in FIG. 10(D), a second resist layer 152 is deposited and patterned to overlie the first photoresist layer 148. 154 is a hole that is formed in the resist layer 152, where an electrically conductive pillar 156 (FIG. 10(E)) described below, will be formed therein.

Following this, as shown in FIG. 10(E), a metal post or other electrically conductive pillar 156 is fabricated through plating a metal, for example, copper, using as a mask the aforementioned second resist layer 152. These electrically conductive pillars 156 are fabricated on the roughened surface of the interconnection layer 150, enabling excellent adhesion between the interconnection layer 150 and the electrically conductive pillar 156, and enabling excellent contact properties.

Following this, as shown in FIG. 10(F), the aforementioned second resist layer 152 is removed. 158 is an interconnect element that results after removing such layer 152.

Following this, a second interconnect element 158a, structured from the aforementioned interconnect element 158, with the electrically conductive pillars 156 removed from the interconnect element 158 (or, more precisely, a structure wherein the electrically conductive pillars 156 were not fabricated) is provided.

Given this, the surface 155 of the interconnect element 158 from which the electrically conductive pillars 156 and the interconnection layer 150 extend and the surface 155 from which the interconnection layer 150 of the interconnect element 158a extends are disposed facing each other, and aligned so that each of the electrically conductive pillars 156 of interconnect element 158 contacts the corresponding interconnection layer 150 of interconnect element 158a. An interlayer insulation layer 160 is interposed between the interconnect element 158a and the interconnect element 158. In this state, heat and pressure are applied to join, e.g. bond, adhere or fuse the interconnect elements 158a and 158 together. FIG. 10(G) shows the state after this joining process.

Following this, the carrier layers 142 and 142 of the interconnect elements 158 and 158a are removed, after which the etching barrier layers 144 and 144 are also removed. Thereafter, the aforementioned metal underlayers 146 and 146 are also removed.

This provides a multilayer interconnect element or wiring board wherein interconnection layers 150 are fabricated on both surfaces of an interlayer insulation layer 160, co-planar therewith. FIG. 10(H) shows the wiring board that is produced through the removal of the metal underlayers 146 and 146.

The multilayer interconnect elements or wiring boards shown and described in this embodiment are similar to those described above, having a structure in which outermost surfaces of the dielectric elements are flat and interconnect patterns exposed at those surfaces are co-planar thereto.

On the other hand, with reference to FIGS. 10(A) through 10(H) the interconnect elements are aligned and joined together and integrated in a state wherein the surfaces on the ends of the electrically conductive pillars 156 are in contact with the corresponding interconnection layer 150. The aforementioned carrier layers 142 and 142 of each of the aforementioned interconnect elements 158 and 158a, the aforementioned etching barrier layers 144 and 144, and the aforementioned metal underlayers 146 and 146 are removed sequentially.

Referring to FIG. 10(H), while the interconnect element 158 on which the electrically conductive pillars 156 are fabricated, and the interconnect element 158a that is structured without these electrically conductive pillars, are layered with an interlayer insulation layer 160 interposed between them. In a variation of such embodiment, interconnect elements 158 and 158, which have electrically conductive pillars 156 extending therefrom can be joined such that the electrically conductive pillars 156 and 156 contact each other, as integrated within an interlayer insulation layer 160 interposed between the two interconnect elements 158.

Figure 11:
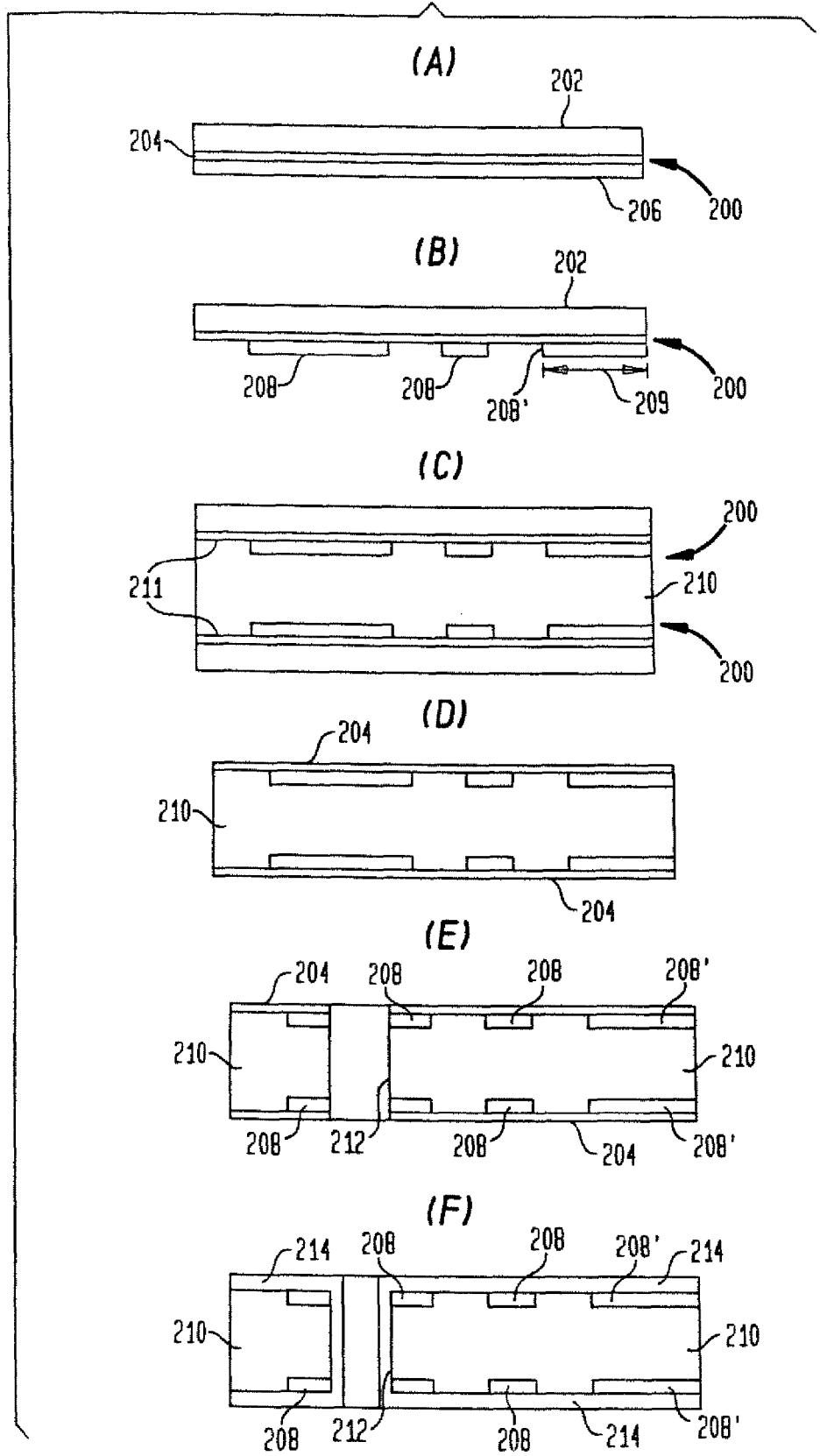
FIGS. 11 (A) through (F) and FIGS. 12(G) through 12(I) are cross-sectional diagrams showing a series of processes in accordance with a seventh embodiment of the present invention.
Figure 12:
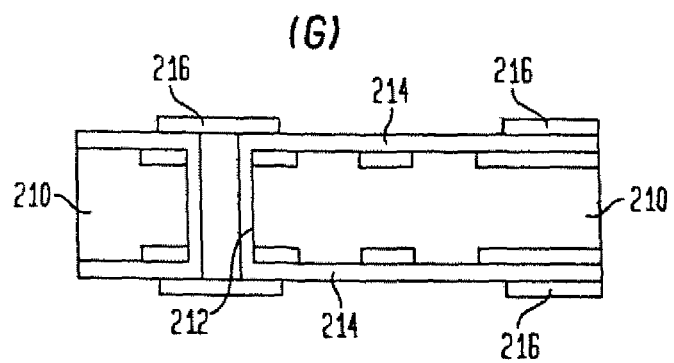
Figure 12:
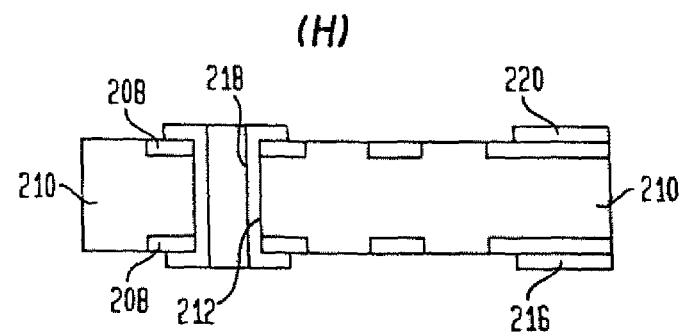
Figure 12:
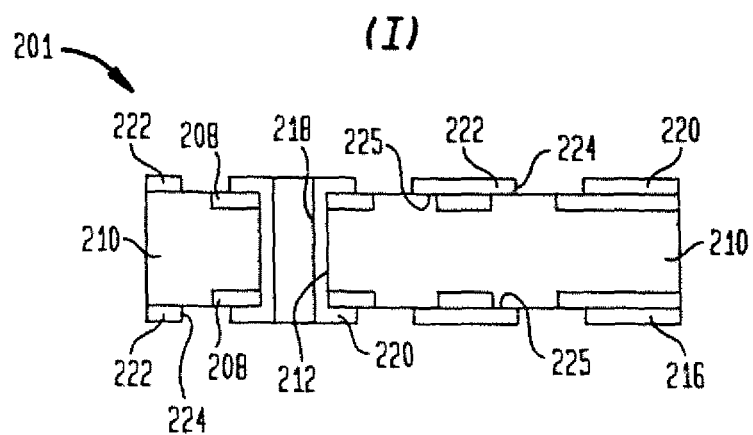

FIGS. 11 (A) through 11(F) and FIGS. 12(G)-12(I) are sectional drawings illustrating a method of manufacturing a multi-layer circuit board in accordance with another embodiment of the present invention.

In a preliminary stage of manufacturing shown in FIG. 11(A), a three-layer metal plate 200 is prepared. The three-layer metal plate 200 includes a support plate 202 which preferably consists essentially of a first metal such as copper. An etch stop layer 204 is disposed to overlie the surface of the support plate, it consisting of an etch distinguishable material such as nickel which is not attacked by a particular etchant that attacks copper. Preferably, the etch stop layer has a thickness which is at least somewhat less than the thickness of the support plate. A third metal layer 206, also preferably consisting essentially of copper, is disposed overlying a rear face of the etch stop layer opposite the support plate. The third metal layer 206 functions as a layer from which circuit wiring patterns will be patterned.

Next, as shown in FIG. 11(B), conductive wiring patterns 208, and 208' are formed by selectively etching the aforesaid metal layer 206. Patterned wiring films 208 and 208' may have different functions and different widths 209 and may be oriented in substantially different directions. Next, as illustrated in FIG. 11 (C), a pair of patterned three-layer metal plates 200 having exposed wiring patterns 208, 208' are laminated together with an intermediate insulating layer 210 to form a unit in which the wiring patterns 208 208' face inward towards the center of the insulating layer 210 and are embedded at the external surfaces 211 of the insulating layer. This lamination can be performed by application of heat and pressure, for example.

Subsequently, as shown in FIG. 11(D), the support plates are removed from the intermediate etch stop layers 204. A through hole 212 (FIG. 11(E)) is then formed to extend through the insulating layer 210 and the etch stop layers 204 and wiring films 208 on the exposed surfaces of the insulating layer.

Next, as shown in FIG. 11(F), a conductive film 214 consisting essentially of copper, for example, is formed to overlie the etch stop layers 204 and insulating layer 210 and within the inner surface of the through hole 212. The conductive film is preferably formed by processing such as electroless plating and/or electroplating a metal such as copper.

Subsequently, as illustrated in FIG. 12(G), a resist film is then formed on the surface of the conductive film 214 and photolithographically processed to form resist patterns 216. Referring to FIG. 12(H), the conductive film 214 on both faces of the insulating layer is then etched together with the etch stop layers that underlie them, using the aforesaid 216 resist patterns as a mask. As a result of this etching, two conductive film patterns are produced. A through hole conductive film 218 overlies an interior surface of the through hole 212 and conductively connects portions of the external wiring patterns 208 which are embedded in each face of the insulating layer 210. A second conductive film 220 is simultaneously formed by this etching process, this conductive film being referred to as a projecting conductive film 220. Subsequently, the projecting cover film 220 can be used for interconnecting the wiring substrate to an external component, for example, an integrated microelectronic or micro-electromechanical device or ("chip"), or to a substrate of a packaged chip.

Next, as shown in FIG. 12(I), an insulating cover film 222 is provided at positions overlying the exposed wiring patterns 208 while leaving the projecting conductive film 220 exposed above the surface of the wiring substrate 201. In one embodiment, the cover film is provided by applying a pre-formed film having an adhesive property from a roll. In another embodiment, the cover film is provided by deposition and subsequent patterning, e.g., by photolithography.

Preferably, the underside of the cover film 222, i.e., the surface 225 of the film which faces the insulating layer 210, is substantially smooth, rather than rough. This makes the cover film easy to apply and to position in relation to the insulating layer 210. In such way, the cover film can be applied so that its position is not misaligned with the projecting conductive film 220 or an escape hole 224 that opens for it.

In addition, since the inner surface 225 of the cover film is not rough, it is easier to apply to the insulating layer and there is reduced risk that the cover film will contact a corner of the wiring film 208 and be damaged in the process, causing its protective effect to be reduced.

The wiring substrate 201 in accordance with FIG. 12(I) provides advantages in permitting external interconnection between wiring film 208' and an external circuit element through projecting conductive film 220. At the same time, other wiring patterns 208 of the substrate are protected against shorting, bridging or other unwanted electrical interaction with external circuit elements by virtue of the insulating cover film 222 provided thereon. In addition, a conductive film 218 provided within the through hole provides interconnection between the wiring patterns 208 at each of the upper and lower faces of the insulating layer.

Figure 13:
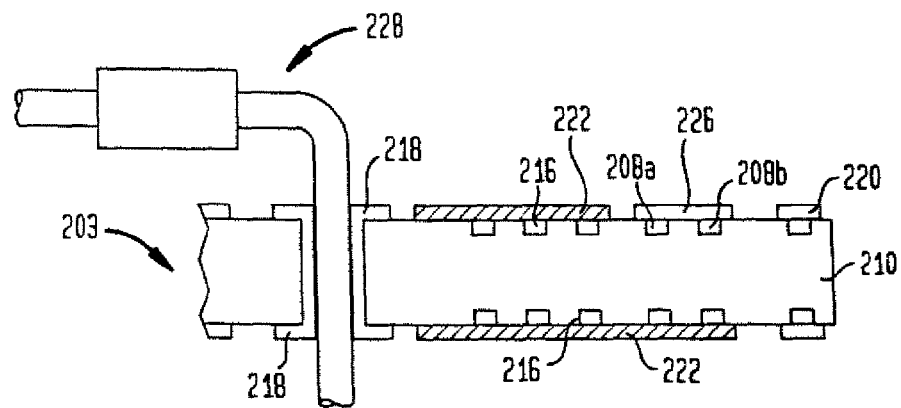
FIG. 13 is a cross-sectional diagram illustrating an interconnect element and its interconnection with an external circuit element in accordance with a variation of the seventh embodiment illustrated in FIG. 12(I).

FIG. 13 is a cross-sectional view illustrating a wiring substrate 203 according to a variation of the embodiment shown in FIG. 12(I). In this embodiment, different sets of the embedded wiring patterns 208a and 208b on the same face of the insulating layer 210 are conductively interconnected by a crossover conductive film 226 patterned to overlie the surface of the insulating layer 210. Preferably, the crossover conductive film is formed simultaneously with the through hole conductive film 218 and projecting conductive film 220 in a manner similar to that described above with reference to FIGS. 12(F), 12(G) and 12(H).

As further illustrated in FIG. 13, a lead 228 of an electronic component, e.g., a lead of a packaged chip, for example, can be inserted into the through hole of the substrate in contact with the through hole conductive film 218 and soldered or otherwise bonded thereto to provided interconnection between the wiring substrate 203 and such packaged chip.

Figure 14:
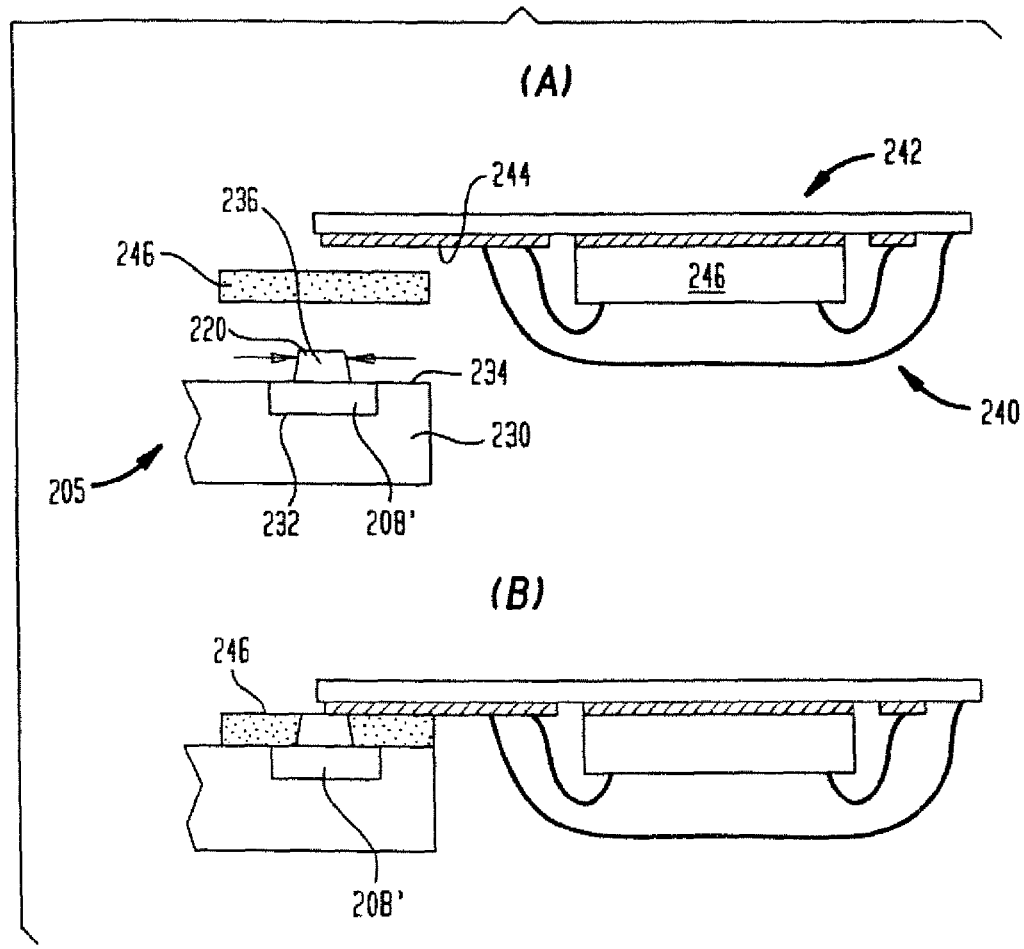
FIGS. 14(A) and 14(B) are cross-sectional diagrams illustrating an interconnect element and its interconnection with an external circuit element in accordance with a further variation of the seventh embodiment illustrated in FIG. 12(I).

FIGS. 14 (A) and 14(B) further illustrate surface mount interconnections between a packaged chip 240 and a wiring substrate 205 in accordance with an embodiment of the invention. In this case, the wiring substrate 205 may be the same as or similar to one of the above-described substrates, e.g., wiring substrate 201 (FIG. 12(I)) or wiring substrate 203 (FIG. 13). Alternatively, a simpler form of wiring substrate can be utilized which includes, at minimum, conductive wiring patterns 208' embedded in recesses 232 at an external surface 234 of an insulating layer 230. A projecting conductive film 220, or a metal interconnection post or pad projects above the exposed surface of the wiring patterns 208', that surface being defined by the external surface 234 of the insulating layer 230. Preferably, the conductive film is formed by the deposition and masked etching of a metal layer preferably including copper, or is formed by electroless plating and/or electroplating.

The packaged chip includes the chip 246 as mounted to a package substrate 242, shown here in exemplary fashion as a dielectric element 248 having conductive wiring patterns 244 on one face, that face being the side to which the chip 246 is mounted.

As particularly shown in FIG. 14(A), the packaged chip 240 is pressed and held against the wiring substrate 205 through an anisotropic conductive film ("ACF") 246 to conductively interconnect the two components, forming an assembly as illustrated in FIG. 14(B). Conductive interconnection is established only where the ACF 246 is compressed to a significant extent, that is at a location such as between the projecting conductive film 220 and the opposed mounting surface 244 of the packaged chip.

Other embedded wiring patterns in the substrate 230 which are in contact with the ACF 246 but not in contact with the projecting conductive film 220 are not at risk for producing unwanted conductive interconnections, e.g., becoming short-circuited. This is because the ACF 246 is compressed only where it overlies features such as the projecting conductive film 220 that extends above the surface 234 of the surface. In addition, by appropriately controlling the width 236 of the projecting conductive film 220, the force applied to compress the ACF 246 against wiring 244 can be spread over a selected surface area to assure both adequacy of contact pressure and adequacy of the surface area through the current-bearing interface between the two components to reduce resistance.

As these and other variations and combinations of the features set forth above can be utilized, the foregoing description of the preferred embodiment should be taken by way of illustration rather than by limitation of the invention.

The invention claimed is:

1. An interconnect element, comprising:
a single layer dielectric element having a first exposed major surface, a plurality of first recesses extending inwardly from said first major surface, and a second exposed major surface remote from said first major surface, a plurality of second recesses extending inwardly from said second major surface;
a plurality of first metal interconnect patterns embedded in said plurality of first recesses and extending in one or more directions along said first major surface; and
a plurality of second metal interconnect patterns embedded in said plurality of second recesses and extending in one or more directions along said second major surface; and
a plurality of non-hollow plated metal posts each extending through said dielectric element between at least one of said plurality of first metal interconnect patterns and at least one of said plurality of second metal interconnect patterns.

2. The interconnect element as claimed in claim 1, wherein said plurality of first metal interconnect patterns have outer surfaces substantially co-planar with said first major surface.

3. The interconnect element as claimed in claim 1, wherein said plurality of second metal interconnect patterns have outer surfaces substantially co-planar with said second major surface.

4. The interconnect element as claimed in claim 1, wherein said dielectric element includes one or more thermoplastic resins.

5. The interconnect element as claimed in claim 1, wherein said dielectric element includes at least one resin selected from the group consisting of PEEK (polyether ether ketone), PES (polyethersulfone), PPS (polyphenylene sulfide), PEN (polyethylene napthalate), a PEEK-PES polymer blend, and liquid crystal polymers.

6. The interconnect element as claimed in claim 1, wherein a thickness of each of said plurality of first metal interconnect patterns is at least 10 microns.

7. The interconnect element as claimed in claim 1, wherein a thickness of each of said plurality of second metal interconnect patterns is at least 10 microns.

8. The interconnect element as claimed in claim 1, wherein each of said plurality of plated metal posts includes copper.

9. The interconnect element as claimed in claim 1, wherein each of said plurality of plated metal posts includes high purity copper.

10. The interconnect element as claimed in claim 1, wherein a length of each of said plurality of plated metal posts is at most 150 microns.

11. The interconnect element as claimed in claim 1, wherein at least some of said plurality of first metal interconnect patterns are traces exposed at the first major surface of said dielectric element.

12. The interconnect element as claimed in claim 1, wherein at least some of said plurality of first metal interconnect patterns are contacts exposed at the first major surface of said dielectric element.

13. The interconnect element as claimed in claim 1, wherein at least some of said plurality of second metal interconnect patterns are traces exposed at the first major surface of said dielectric element.

14. The interconnect element as claimed in claim 1, wherein at least some of said plurality of second metal interconnect patterns are contacts exposed at the second major surface of said dielectric element.

15. The interconnect element as claimed in claim 1, wherein said plurality of first metal interconnect patterns are coated with a bond metal layer.

16. The interconnect element as claimed in claim 15, wherein said bond metal layer includes gold.

17. The interconnect element as claimed in claim 1, wherein said plurality of second metal interconnect patterns are coated with a bond metal layer.

18. The interconnect element as claimed in claim 17, wherein said bond metal layer includes gold.

19. The interconnect element as claimed in claim 1, wherein said interconnect element is suitable for heating to a temperature of between 150 and 350° C.

20. The interconnect element as claimed in claim 1, wherein said interconnect element is suitable for exposure to a pressure between 20 and 100 kg/cm².

21. The interconnect element as claimed in claim 1, wherein said plurality of non-hollow plated metal posts are joined to said at least some first metal interconnect patterns.

22. The interconnect element as claimed in claim 1, wherein said plurality of non-hollow plated metal posts are joined using one or more of heat and pressure to said at least some first metal interconnect patterns.

23. The interconnect element as claimed in claim 1, wherein contact areas are defined wherever ends of said non-hollow plated metal posts contact said at least some first metal interconnect patterns, and at each such contact area, the first metal interconnect pattern in which that contact area is defined has its edges outside of the contact area.

24. The interconnect element as claimed in claim 1, wherein contact areas are defined wherever ends of said non-hollow plated metal posts contact said at least some second metal interconnect patterns, and at each such contact area, the second metal interconnect pattern in which that contact area is defined has its edges outside of the contact area.

25. The interconnect element as claimed in claim 1, wherein the plurality of first metal interconnect patterns have inner surfaces which contact bottom surfaces of the plurality of first recesses, the plurality of second metal interconnect patterns have inner surfaces which contact bottom surfaces of the plurality of second recesses, and the plurality of non-hollow plated metal posts each extend through the dielectric element between the inner surface of the at least one of the plurality of first metal interconnect patterns and the inner surface of the at least one of the plurality of second metal interconnect patterns.

* * * * *